(12) United States Patent
Huang et al.

(10) Patent No.: US 12,205,982 B2
(45) Date of Patent: *Jan. 21, 2025

(54) TRENCH PATTERN FOR TRENCH CAPACITOR YIELD IMPROVEMENT

(71) Applicant: Taiwan Semiconductor Manufacturing Company, Ltd., Hsinchu (TW)

(72) Inventors: Yuan-Sheng Huang, Taichung (TW); Yi-Chen Chen, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/512,096

(22) Filed: Nov. 17, 2023

(65) Prior Publication Data

US 2024/0088210 A1  Mar. 14, 2024

Related U.S. Application Data

(63) Continuation of application No. 18/076,780, filed on Dec. 7, 2022, now Pat. No. 11,855,133, which is a
(Continued)

(51) Int. Cl.
*H01L 29/66* (2006.01)
*H01L 29/94* (2006.01)
*H01L 49/02* (2006.01)

(52) U.S. Cl.
CPC ............. *H01L 28/91* (2013.01); *H01L 28/90* (2013.01); *H01L 29/66181* (2013.01); *H01L 29/945* (2013.01); *H01L 28/40* (2013.01)

(58) Field of Classification Search
CPC ............. H01L 29/66181; H01L 29/945; H01L 28/90–92
See application file for complete search history.

(56) References Cited

U.S. PATENT DOCUMENTS 5,354,710 A   10/1994  Kawaguchi et al.
6,433,379 B1   8/2002  Lopatin et al.
(Continued)

OTHER PUBLICATIONS

Hyun, Jay. "Memory Systems for the Data-Intensive Applications (GDDR6, HBM2, HBM2E, and More . . . )" The Media News, published on Oct. 21, 2019.
(Continued)

*Primary Examiner* — Jose R Diaz
(74) *Attorney, Agent, or Firm* — Eschweiler & Potashnik, LLC; David Potashnik

(57) ABSTRACT

Various embodiments of the present disclosure are directed towards a trench capacitor with a trench pattern for yield improvement. The trench capacitor is on a substrate and comprises a plurality of capacitor segments. The capacitor segments extend into the substrate according to the trench pattern and are spaced with a pitch on an axis. The plurality of capacitor segments comprises an edge capacitor segment at an edge of the trench capacitor and a center capacitor segment at a center of the trench capacitor. The edge capacitor segment has a greater width than the center capacitor segment and/or the pitch is greater at the edge capacitor segment than at the center capacitor segment. The greater width may facilitate stress absorption and the greater pitch may increase substrate rigidity at the edge of the trench capacitor where thermal expansion stress is greatest, thereby reducing substrate bending and trench burnout for yield improvements.

20 Claims, 25 Drawing Sheets

Related U.S. Application Data continuation of application No. 17/140,374, filed on Jan. 4, 2021, now Pat. No. 11,545,543.

(60) Provisional application No. 63/106,028, filed on Oct. 27, 2020.

(56) References Cited

U.S. PATENT DOCUMENTS

| | | | |
|---|---|---|---|
| 10,546,917 | B1 | 1/2020 | Tsai et al. |
| 11,545,543 | B2 | 1/2023 | Huang et al. |
| 11,855,133 | B2 * | 12/2023 | Huang .................... H01L 28/90 |
| 2006/0057814 | A1 | 3/2006 | Weis |
| 2008/0291601 | A1 | 11/2008 | Roozeboom et al. |
| 2010/0181645 | A1 | 7/2010 | Marenco |
| 2011/0042755 | A1 | 2/2011 | Juenling |
| 2012/0267680 | A1 | 10/2012 | Oya et al. |
| 2013/0161792 | A1 | 6/2013 | Tran et al. |
| 2015/0028450 | A1 | 1/2015 | Park et al. |
| 2015/0305159 | A1 | 10/2015 | Yamamoto et al. |
| 2018/0197862 | A1 | 7/2018 | Sills et al. |
| 2019/0245031 | A1 | 8/2019 | Lin et al. |
| 2020/0152730 | A1 | 5/2020 | Lai et al. |
| 2020/0161416 | A1 | 5/2020 | Tsai et al. |
| 2020/0243537 | A1 | 7/2020 | Li et al. |

OTHER PUBLICATIONS

Hyun, Jay. "IEDM 2019 (Part 2) 3D_Packaging Innovation and Memory Technology (Ferroelectrics)." The Media News, published on Dec. 31, 2019.

Elisabeth, Stephanie. "TSMC Deep Trench Capacitor Land-Side Decoupling Capacitor in Apple's A10 Application Processor." SystemPlus Consulting, published Oct. 2016.

Non-Final Office Action dated Mar. 25, 2022 for U.S. Appl. No. 17/140,374.

Final Office Action dated Jul. 21, 2022 for U.S. Appl. No. 17/140,374.

Notice of Allowance dated Sep. 29, 2022 for U.S. Appl. No. 17/140,374.

Non-Final Office Action dated Jun. 7, 2023 for U.S. Appl. No. 18/076,780.

Notice of Allowance dated Sep. 5, 2023 for U.S. Appl. No. 18/076,780.

* cited by examiner

TRENCH PATTERN FOR TRENCH CAPACITOR YIELD IMPROVEMENT

REFERENCE TO RELATED APPLICATIONS

This application is a Continuation of U.S. application Ser. No. 18/076,780, filed on Dec. 7, 2022, which is a Continuation of U.S. application Ser. No. 17/140,374, filed on Jan. 4, 2021 (now U.S. Pat. No. 11,545,543, issued on Jan. 3, 2023), which claims the benefit of U.S. Provisional Application No. 63/106,028, filed on Oct. 27, 2020. The contents of the above-referenced Patent Applications are hereby incorporated by reference in their entirety.

BACKGROUND

An integrated passive device (IPD) is a collection of one or more passive devices integrated on a semiconductor substrate. Passive devices may include, for example, capacitors, resistors, inductors, and so on. IPDs are formed using semiconductor manufacturing processes and are packaged as integrated circuits (ICs). This leads to reduced size, reduced cost, and increased functional density compared to discrete passive devices. IPDs find application with, among things, mobile devices and application processors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
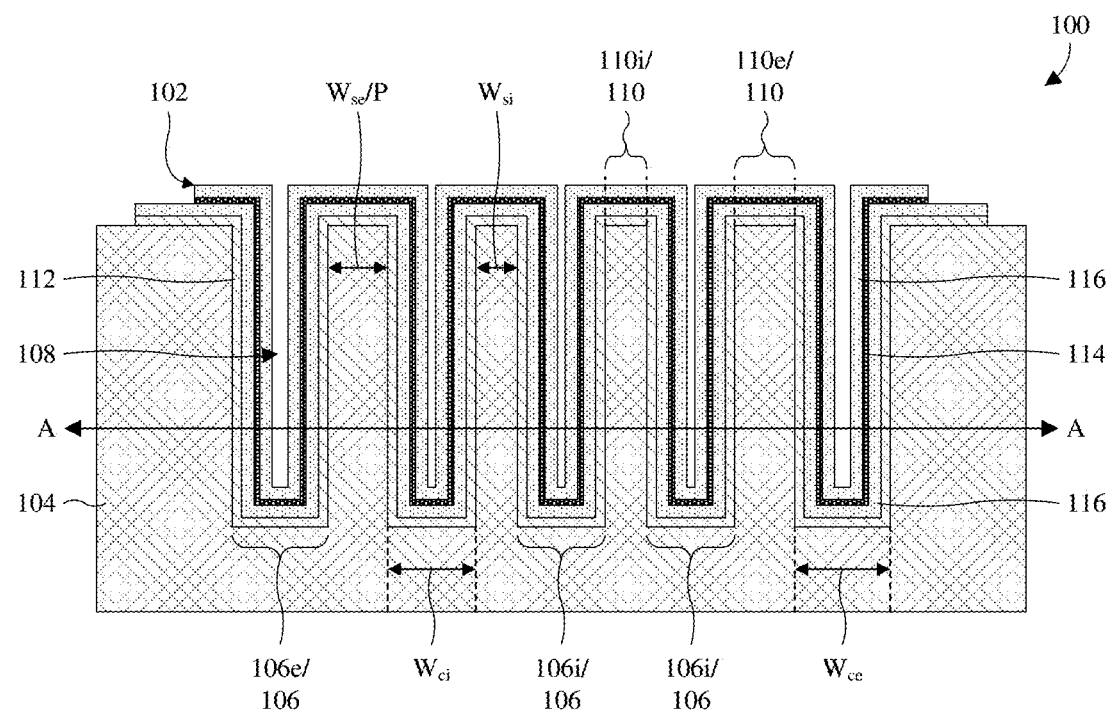
FIG. 1 illustrates a cross-sectional view of some embodiments of a trench capacitor with a trench pattern for yield improvement.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated passive device (IPD) may comprise a substrate and a trench capacitor on the substrate. The trench capacitor comprises a plurality of capacitor electrodes and a plurality of capacitor dielectric layers. The capacitor electrodes and the capacitor dielectric layers are alternatingly stacked over the substrate and define a plurality of in-trench capacitor segments. The in-trench capacitor segments extend into the substrate and are laterally separated from each other by segments of the substrate. The in-trench capacitor segments and the substrate segments have line-shaped top layouts elongated in parallel and have uniform widths.

A challenge with the trench capacitor is that the substrate, the capacitor dielectric layers, and the capacitor electrodes may have different coefficients of the thermal expansion. For example, metallic materials of the trench capacitor may have higher coefficients of thermal expansion than the substrate. During high temperature processes or high voltage processes, the different coefficients of thermal expansion may lead to the in-trench capacitor segments expanding more rapidly than the substrate. As a result, the in-trench capacitor segments may apply stress on the substrate. The stress is neutral at a center of the trench capacitor due to symmetry in the trench capacitor and hence in the stress pattern. However, the stress increases from the center of the trench capacitor to edges of the trench capacitor in directions transverse to that which the in-trench capacitor segments and the substrate segments are elongated. The stress may lead to bending of the substrate segments and/or trench burnout, especially at the edges of the trench capacitor. Trench burnout may, for example, correspond to dielectric breakdown of a capacitor dielectric layer due to thinning of a capacitor dielectric layer from the stress. Further, the stress is expected to get worse as the substrate segments and the trench segments get smaller and smaller. Bending of the substrate segments and/or trench burnout, in turn, degrades bulk manufacturing yields.

Various embodiments of the present disclosure are directed towards a method for forming a trench capacitor with a trench pattern for yield improvement, as well as the resulting trench capacitor. According to some embodiments, a trench capacitor is on a substrate and comprises a plurality of in-trench capacitor segments. The plurality of in-trench capacitor segments comprises an edge in-trench capacitor segment at an edge of the trench capacitor and a center in-trench capacitor segment at a center of the trench capacitor. The in-trench capacitor segments extend into the substrate and are spaced with a pitch on an axis. The edge in-trench capacitor segment has a greater width than the center in-trench capacitor segment and/or the pitch is greater at the edge in-trench capacitor segment than at the center in-trench capacitor segment.

When the edge in-trench capacitor segment has the greater width than the center in-trench capacitor segment, the edge in-trench capacitor segment may have a large gap for stress absorption where stress is greatest. When the pitch is greater at the edge in-trench capacitor segment than at the center in-trench capacitor segment, the substrate is more rigid and hence less prone to bending where stress is greatest. Therefore, because the edge in-trench capacitor segment has a greater width and/or the pitch is greater at the edge in-trench capacitor segment, bending of the substrate and/or trench burnout may be reduced to increase bulk manufacturing yields.

With reference to FIG. 1, a cross-sectional view 100 of some embodiments of a trench capacitor 102 with a trench pattern for yield improvement is provided. The trench capacitor 102 may be, or may be part of, an integrated circuit (IC), an IPD, or some other suitable structure. The trench capacitor 102 overlies a substrate 104 and has a plurality of in-trench capacitor segments 106. The in-trench capacitor segments 106 are laterally separated with a pitch P along an axis A and protrude or otherwise extend into the substrate 104 according to the trench pattern. Further, the in-trench capacitor segments 106 define individual gaps 108 recessed into the substrate 104. In alternative embodiments, one, some, or all of the gaps 108 is/are omitted.

Similar to the trench capacitor 102, the substrate 104 has a plurality of substrate segments 110. The substrate segments 110 are laterally separated along the axis A. Further, the substrate segments 110 protrude or otherwise extend upward between the in-trench capacitor segments 106 to separate the in-trench capacitor segments 106. For example, the in-trench capacitor segments in each pair of neighboring in-trench capacitor segments may be separated by a corresponding substrate segment. The substrate 104 may, for example, be a bulk silicon substrate, a bulk oxide substrate, or some other suitable type of substrate.

In some embodiments, the in-trench capacitor segments 106 may be regarded as in-trench capacitor fingers and the substrate segments 110 may be regarded as substrate fingers interdigitated with the in-trench capacitor fingers. Further, in some embodiments, the in-trench capacitor segments 106 and the substrate segments 110 are line shaped and elongated in parallel in a direction transverse to the axis A when viewed top down. In at least some of such embodiments, the in-trench capacitor segments 106 and the substrate segments 110 may be regarded respectively as in-trench capacitor lines and substrate lines.

The plurality of in-trench capacitor segments 106 comprises a pair of edge in-trench capacitor segments 106e and a plurality of interior in-trench capacitor segments 106i. The edge in-trench capacitor segments 106e are respectively at opposite edges of the trench capacitor 102, and the interior in-trench capacitor segments 106i are between the edge in-trench capacitor segments 106e. The edge in-trench capacitor segments 106e have individual capacitor edge widths $W_{ce}$, and the interior in-trench capacitor segments 106i have individual capacitor interior widths $W_{ci}$ less than the capacitor edge widths $W_{ce}$. The capacitor edge widths $W_{ce}$ are the same and the capacitor interior widths $W_{ci}$ are the same. In other embodiments, the capacitor edge widths $W_{ce}$ are different and/or the capacitor interior widths $W_{ci}$ are different.

The plurality of substrate segments 110 comprises a pair of edge substrate segments 110e and a plurality of interior substrate segments 110i. The edge substrate segments 110e are between and respectively border the edge in-trench capacitor segments 106e, and the interior substrate segments 110i are between the edge substrate segments 110e. The edge substrate segments 110e have individual substrate edge widths $W_{se}$, and the interior substrate segments 110i have individual substrate interior widths $W_{si}$ less than the substrate edge widths $W_{se}$. The substrate edge widths $W_{se}$ are the same and the substrate interior widths $W_{si}$ are the same. In other embodiments, the substrate edge widths $W_{se}$ are different and/or the substrate interior widths $W_{si}$ are different. Because the substrate edge widths $W_{se}$ are greater than the substrate interior widths $W_{si}$, the pitch P is greater at the edge substrate segments 110e than at the interior substrate segments 110i. The pitch P is the same at the edge substrate segments 110e and is the same at the interior substrate segments 110i. In other embodiments, the pitch P is different at the edge substrate segments 110e and/or is different at the interior substrate segments 110i.

The in-trench capacitor segments 106 may have greater coefficients of thermal expansion than the substrate segments 110, such that the in-trench capacitor segments 106 may expand by a greater amount than the substrate segments 110 during high temperature processes and/or high voltage processes. As a result, the in-trench capacitor segments 106 may apply stress on the substrate segments 110. The stress is neutral at a center of the trench capacitor 102 due to symmetry in the trench capacitor 102 and hence in the stress pattern. However, the stress increases from the center of the trench capacitor 102 to edges of the trench capacitor 102 along the axis A. Absent the greater widths of the edge in-trench capacitor segments 106e and the greater widths of the edge substrate segments 110e, the stress may lead to bending of the edge substrate segments 110e and/or trench burnout at the edge in-trench capacitor segments 106e.

Because the substrate edge widths $W_{se}$ are greater than the substrate interior widths $W_{si}$, the edge substrate segments 110e have greater rigidity than the interior substrate segments 110i. As a result, the edge substrate segments 110e are less prone to bending and trench burnout at the edge in-trench capacitor segments 106e is reduced. Because the capacitor edge widths $W_{ce}$ are greater than the capacitor interior widths $W_{ci}$, the gaps 108 of the edge in-trench capacitor segments 106e are larger than the gaps 108 of the interior in-trench capacitor segments 106i. The gaps 108 facilitate stress absorption, and the larger gaps at the edge in-trench capacitor segments 106e provide increased stress absorption at the edges of the trench capacitor 102 where stress is greatest. As a result, the edge substrate segments 110e are less prone to bending and trench burnout at the edge in-trench capacitor segments 106e is reduced. Because the greater widths of the edge in-trench capacitor segments 106e and the greater widths of the edge substrate segments 110e reduce bending and trench burnout, bulk manufacturing yields may be increased.

The trench capacitor 102 comprises a dielectric liner layer 112, a capacitor dielectric layer 114, and a pair of capacitor electrodes 116. The dielectric liner layer 112, the capacitor dielectric layer 114, and the capacitor electrodes 116 are stacked and define the in-trench capacitor segments 106. The capacitor dielectric layer 114 is between the capacitor electrodes 116, and the capacitor dielectric layer 114 and the capacitor electrodes 116 overlie the dielectric liner layer 112. The dielectric liner layer 112, the capacitor dielectric layer 114, and the capacitor electrodes 116 decrease in width from a bottom of the trench capacitor 102 to a top of the trench capacitor 102. The dielectric liner layer 112 is localized to the trench capacitor 102 and has a same width as a bottom one of the capacitor electrodes 116. In other embodiments, the dielectric liner layer 112 blankets a top of the substrate 104 and has a greater width than the bottom one of the capacitor electrodes 116. The capacitor dielectric layer 114 and a top one of the capacitor electrodes 116 have a same width that is less than that of the bottom one of the capacitor electrodes 116. In other embodiments, the capacitor dielectric layer 114 and the bottom one of the capacitor electrodes 116 have a same width that is greater than that of the top one of the capacitor electrodes 116.

The dielectric liner layer 112 may, for example, be or comprise silicon oxide and/or some other suitable dielectric(s). The capacitor dielectric layer 114 may, for example, be or comprise silicon oxide, a high k dielectric layer, some other suitable dielectric(s), or any combination of the foregoing. The high k dielectric layer may, for example, be or comprise hafnium oxide, zirconium oxide, aluminum oxide, tantalum oxide, titanium oxide, some other suitable metal oxide(s), some other suitable high k dielectric(s), or any combination of the foregoing. The capacitor electrodes 116 may, for example, be or comprise doped polysilicon, titanium nitride, tantalum nitride, aluminum copper, some other suitable metal(s) and/or conductive material(s), or any combination of the foregoing.

In some embodiments, the substrate 104 is or comprises silicon, the dielectric liner layer 112 is or comprises silicon oxide, the capacitor dielectric layer 114 is or comprises hafnium oxide, and the capacitor electrodes 116 are or comprise titanium nitride. Other suitable materials are, however, amenable. In some embodiments, the capacitor electrodes 116 and the capacitor dielectric layer 114 have greater coefficients of thermal expansion than the dielectric liner layer 112 and the substrate 104. For example, the substrate 104 may have a coefficient of thermal expansion of about $2.5 \times 10^{-6}$/K, the dielectric liner layer 112 may have a coefficient of thermal expansion of about $0.5 \times 10^{-6}$/K, the capacitor dielectric layer 114 may have a coefficient of thermal expansion of about $5.6 \times 10^{-6}$/K, and the capacitor electrodes 116 may have a coefficient of thermal expansion of about $10.3 \times 10^{-6}$/K. Other suitable coefficients of thermal expansion are, however, amenable. In some embodiments, the capacitor edge widths $W_{ce}$ and the capacitor interior widths $W_{ci}$ are each about 0.2-0.6 micrometers, about 0.2-0.4 micrometers, about 0.4-0.6 micrometers, about 0.4 micrometers, or about 0.3 micrometers. Other suitable values are, however, amenable.

While the trench layout of FIG. 1 (e.g., the area occupied by the in-trench capacitor segments 106 of FIG. 1) focuses on a trench capacitor 102, it is to be appreciated that the trench layout has applicability to other suitable devices using a metal-insulator-metal (MIM) structure with in-trench segments. For example, dynamic random-access memory (DRAM) devices and micro-electromechanical system (MEMS) devices may have such a MIM structure.

Figure 2:
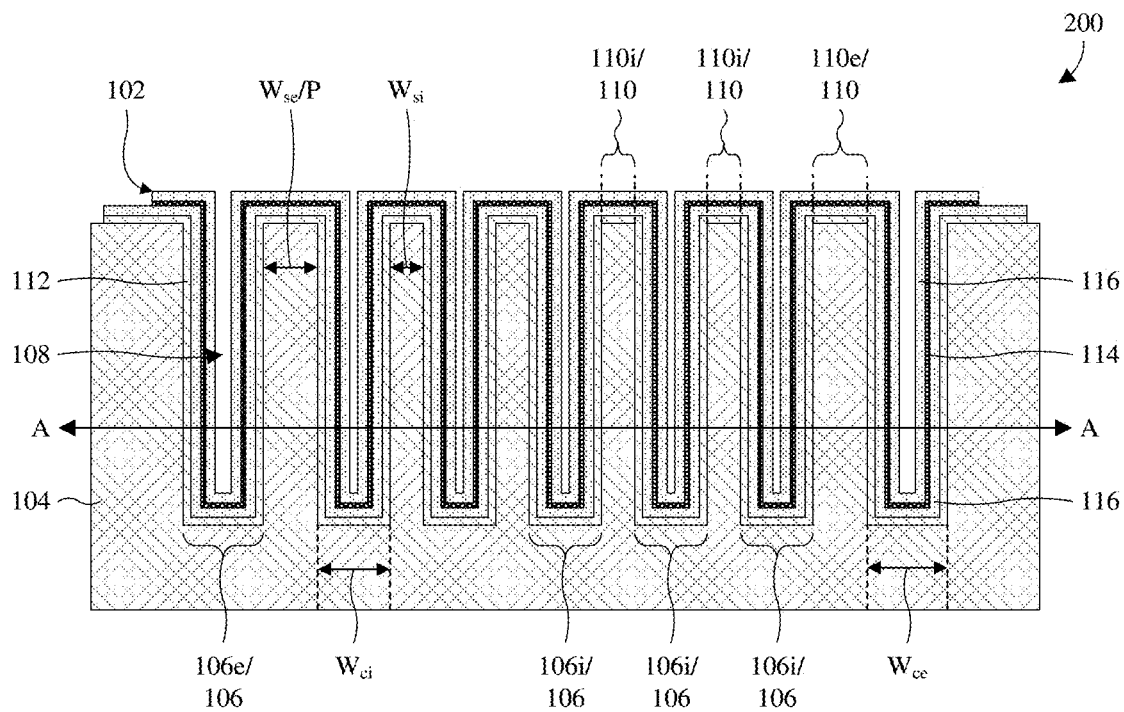
FIG. 2 illustrates a cross-sectional view of some alternative embodiments of the trench capacitor of FIG. 1 in which the trench capacitor has additional in-trench capacitor segments and additional substrate segments.

With reference to FIG. 2, a cross-sectional view 200 of some alternative embodiments of the trench capacitor 102 of FIG. 1 is provided in which the trench capacitor 102 has additional in-trench capacitor segments 106 and additional substrate segments 110. For example, instead of five in-trench capacitor segments 106 and four substrate segments 110, the trench capacitor 102 may have seven in-trench capacitor segments 106 and six substrate segments 110. In other embodiments, the trench capacitor 102 may have N in-trench capacitor segments 106 and N−1 substrate segments 110, where N is an integer variable greater than one.

Figure 3:
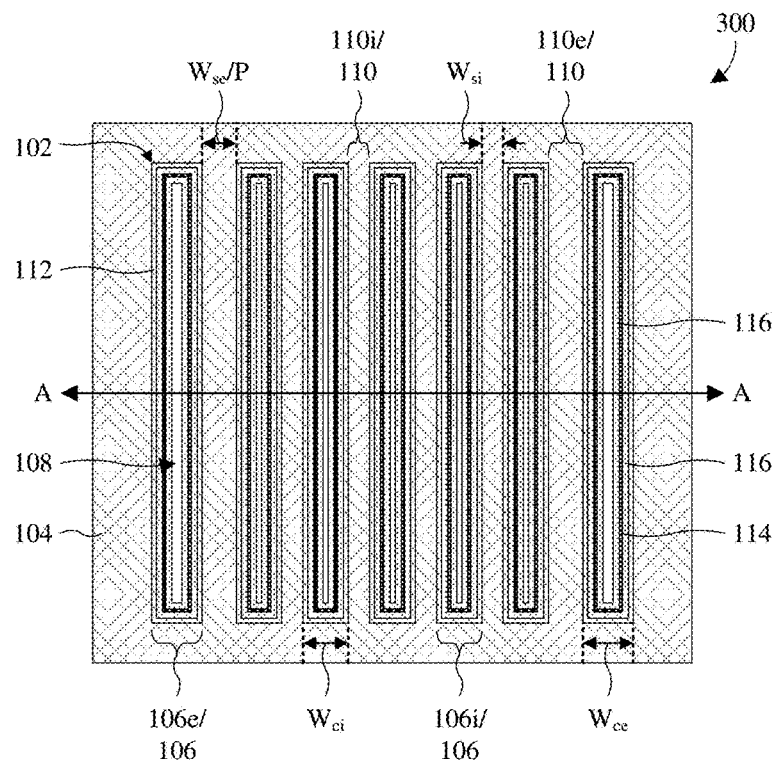
FIG. 3 illustrates a top layout of some embodiments of the in-trench capacitor segments of FIG. 2.

With reference to FIG. 3, a top layout 300 of some embodiments of the in-trench capacitor segments 106 of FIG. 2 is provided. The top layout 300 may, for example, be taken along the axis A in FIG. 2, and/or the cross-sectional view 200 of FIG. 2 may, for example, be taken along the axis A in FIG. 3. The in-trench capacitor segments 106 and the substrate segments 110 are line shaped and elongated in parallel in a direction orthogonal to or otherwise transverse to the axis A. Further, the substrate 104 extends in a plurality of closed paths individual to and respectively surrounding the in-trench capacitor segments 106. As a result, the in-trench capacitor segments 106 are unconnected in the top layout 300 of FIG. 3.

With reference to FIGS. 4A-4E, top layouts 400A-400E of some alternative embodiments of the in-trench capacitor segments 106 of FIG. 3 are provided. Any of the top layouts 400A-400E may, for example, be taken along the axis A in FIG. 2, and/or the cross-sectional view 200 of FIG. 2 may, for example, be taken along the axis A in any of FIGS. 4A-4E.

Figure 4A:
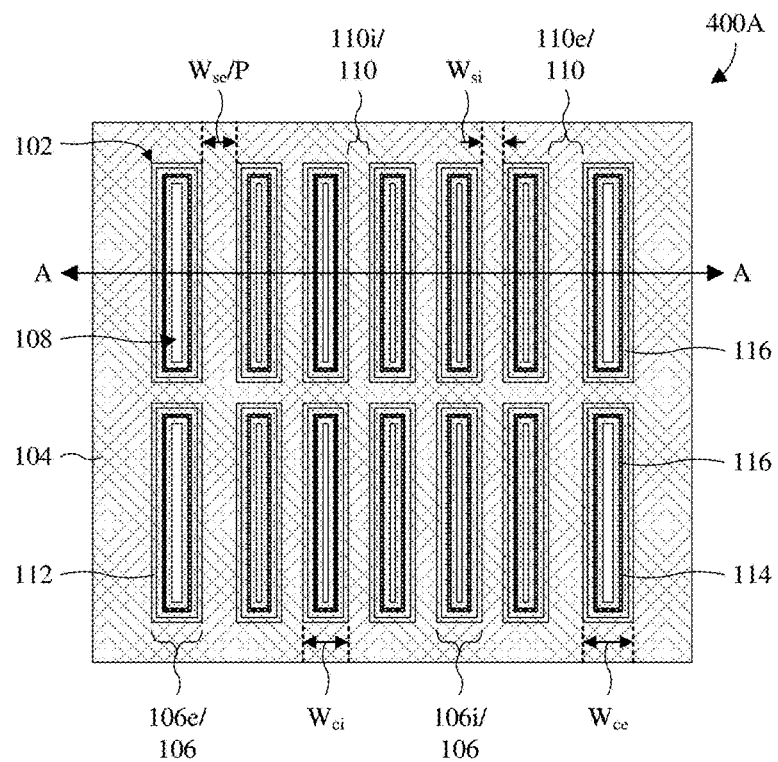
FIGS. 4A-4E illustrate top layouts of some alternative embodiments of the in-trench capacitor segments of FIG. 3.

In FIG. 4A, the in-trench capacitor segments 106 are in a plurality of rows. For example, the in-trench capacitor segments 106 may be in two rows. In other embodiments, the in-trench capacitor segments 106 are in more rows.

Figure 4B:
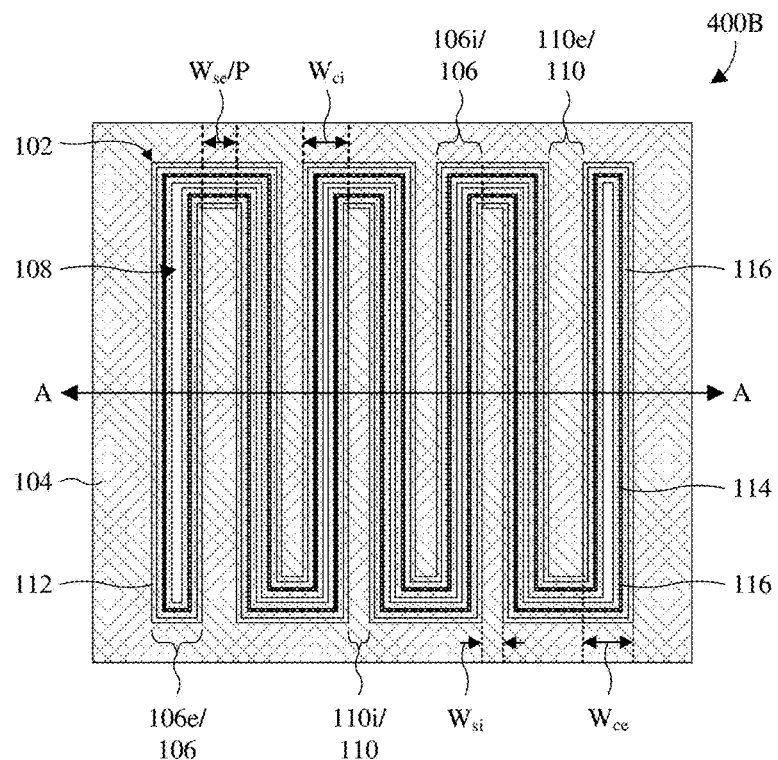

In FIG. 4B, the in-trench capacitor segments 106 are connected in a serpentine trench pattern along the axis A.

Figure 4C:
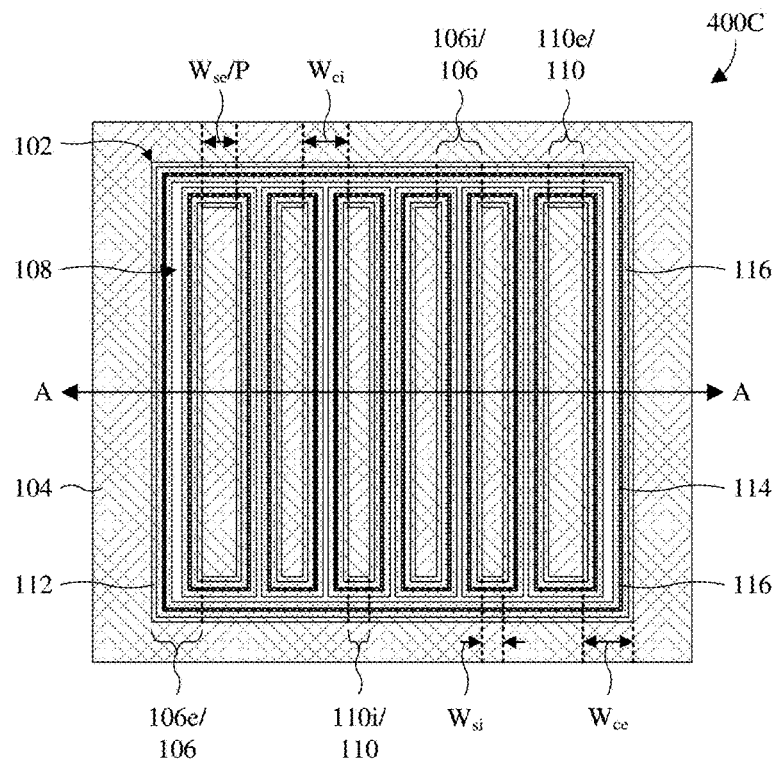

In FIG. 4C, the in-trench capacitor segments 106 are connected in a pattern that extends in a plurality of closed paths individual to and respectively surrounding the substrate segments 110. As a result, the substrate segments 110 are unconnected in the top layout 400C of FIG. 4C.

Figure 4D:
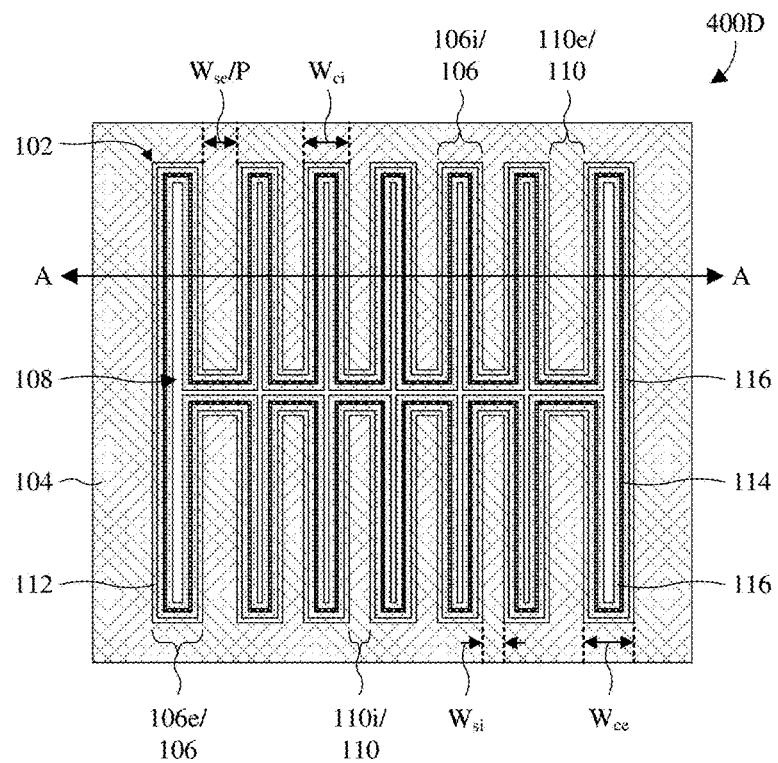

In FIG. 4D, the in-trench capacitor segments 106 are connected at length wise centers. Lengths of the in-trench capacitor segments 106 correspond to dimensions in a direction along which the in-trench capacitor segments 106 are elongated in parallel. As above, such a direction is orthogonal to or otherwise transverse to the axis A.

Figure 4E:
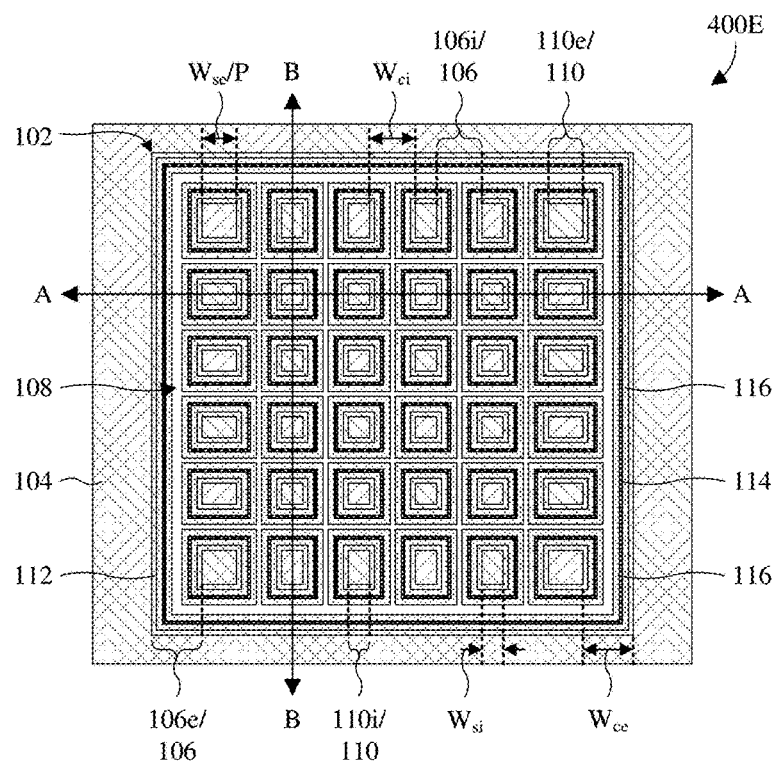

In FIG. 4E, the in-trench capacitor segments 106 are connected in a grid trench pattern. As a result, the substrate segments 110 are in a plurality of rows and plurality of columns, and the grid trench pattern extends in a plurality of closed paths individual to and respectively surrounding the substrate segments 110. Further, the grid trench pattern is unchanged if rotated 90 degrees about a center of the grid trench pattern, such that the grid trench pattern has rotational symmetry. Because of the rotational symmetry, the cross-sectional view 200 of FIG. 2 may also be taken along an axis B orthogonal to the axis A.

Figure 5:
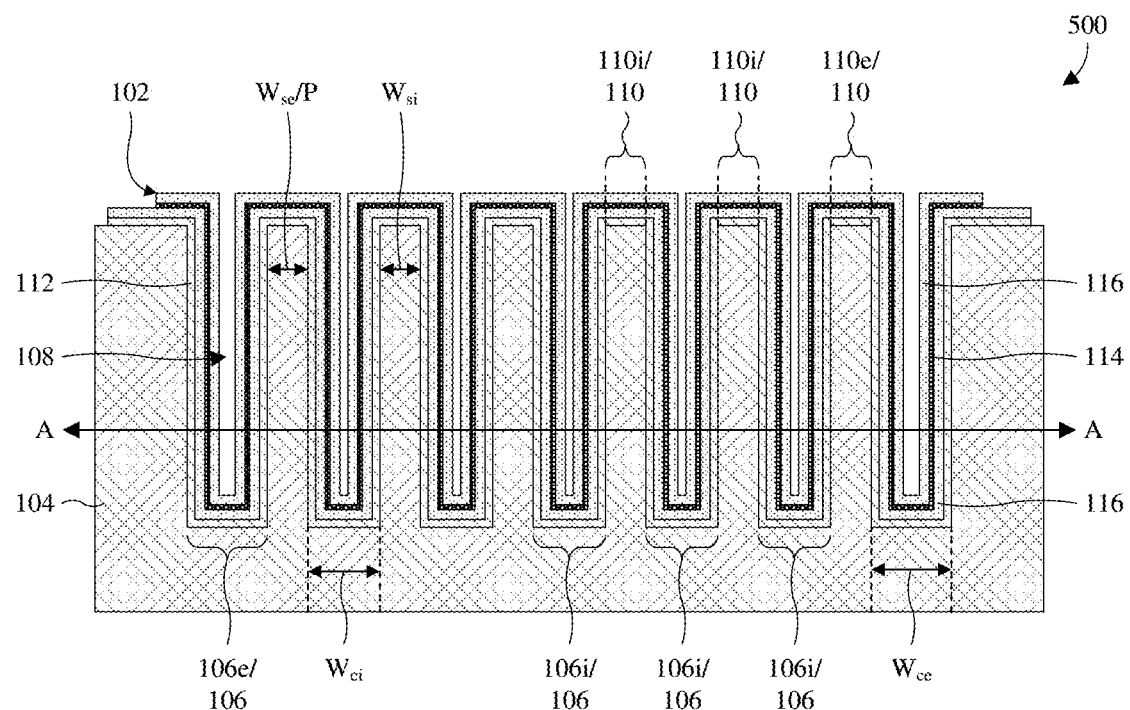
FIGS. 5-9 illustrate cross-sectional views of some alternative embodiments of the trench capacitor of FIG. 2 in which the trench pattern is varied.

With reference to FIG. 5, a cross-sectional view 500 of some alternative embodiments of the trench capacitor 102 of FIG. 2 is provided in which the substrate edge widths $W_{se}$ and the substrate interior widths $W_{si}$ are the same. In other words, the pitch P is uniform from a center of the trench capacitor 102 to edges of the trench capacitor 102. Further, the capacitor edge widths $W_{ce}$ remain greater than the capacitor interior widths $W_{ci}$ for enhanced stress absorption at the edges of the trench capacitor 102. As above, this may mitigate substrate bending and/or trench burnout at the edges of the trench capacitor 102 and may hence increase bulk manufacturing yields.

Figure 6:
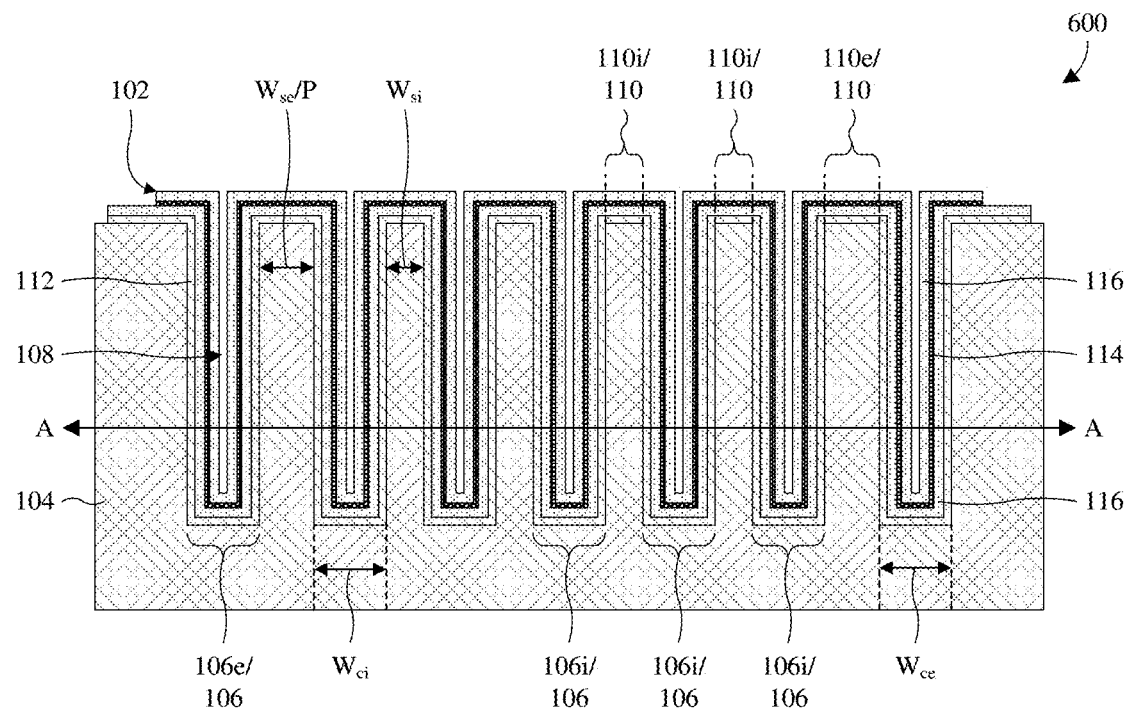

With reference to FIG. 6, a cross-sectional view 600 of some alternative embodiments of the trench capacitor 102 of FIG. 2 is provided in which the capacitor edge widths $W_{ce}$ and the capacitor interior widths $W_{ci}$ are the same. Further, the substrate edge widths $W_{se}$ remain greater than the substrate interior widths $W_{si}$ for increased rigidity at edges of the trench capacitor 102. As described above, this may mitigate substrate bending and/or trench burnout at the edges of the trench capacitor 102 and may hence increase bulk manufacturing yields.

Figure 7:
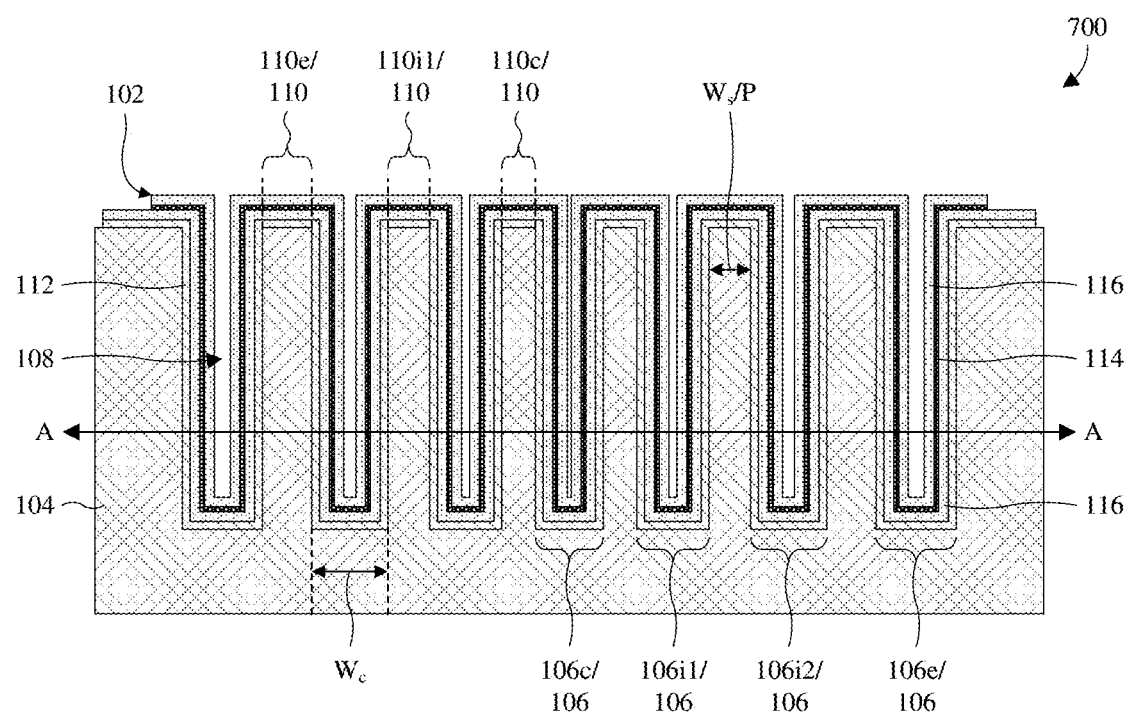

With reference to FIG. 7, a cross-sectional view 700 of some alternative embodiments of the trench capacitor 102 of FIG. 2 is provided in which individual capacitor widths $W_c$ of the in-trench capacitor segments 106 increase gradually from a center of the trench capacitor 102 to edges of the trench capacitor 102 along the axis A. Further, individual substrate widths $W_s$ of the substrate segments 110 increase gradually from the center of the trench capacitor 102 to the edges of the trench capacitor 102 along the axis A. In other words, the pitch P increases gradually from the center of the trench capacitor 102 to the edges of the trench capacitor 102 along the axis A.

Focusing on the capacitor widths $W_c$, a center in-trench capacitor segment 106c has a lesser width than first interior in-trench capacitor segments 106i1 neighboring the center in-trench capacitor segment 106c and between which the center in-trench capacitor segment 106c is arranged. The first interior in-trench capacitor segments 106i1 have lesser widths than second interior in-trench capacitor segments 106i2 respectively neighboring the first interior in-trench capacitor segments 106i1 and between which the first interior in-trench capacitor segments 106i1 are arranged. The second interior in-trench capacitor segments 106i2 have lesser widths than edge in-trench capacitor segments 106e respectively neighboring the second interior in-trench capacitor segments 106i2 and between which the second interior in-trench capacitor segments 106i2 are arranged. The capacitor widths $W_c$ of the first interior in-trench capacitor segments 106i1 are the same, the capacitor widths $W_c$ of the second interior in-trench capacitor segments 106i2 are the same, and the capacitor widths $W_c$ of the edge in-trench capacitor segments 106e are the same. In other embodiments, the capacitor widths $W_c$ of the first interior in-trench capacitor segments 106i1 are different, the capacitor widths $W_c$ of the second interior in-trench capacitor segments 106i2 are different, the capacitor widths $W_c$ of the edge in-trench capacitor segments 106e are different, or any combination of the foregoing.

Focusing on the substrate widths $W_s$, center substrate segments 110c have lesser widths than first interior substrate segments 110i1 respectively neighboring the center substrate segments 110c and between which the center substrate segments 110c are arranged. The first interior substrate segments 110i1 have lesser widths than edge substrate segments 110e respectively neighboring the first interior substrate segments 110i1 and between which the first interior substrate segments 110i1 are arranged. The substrate widths $W_s$ of the center substrate segments 110c are the same, the substrate widths $W_s$ of the first interior substrate segments 110i1 are the same, and the substrate widths $W_s$ of the edge substrate segments 110e are the same. In other embodiments, the substrate widths $W_s$ of the center substrate segments 110c are different, the substrate widths $W_s$ of the first interior substrate segments 110i1 are different, the substrate widths $W_s$ of edge substrate segments 110e are different, or any combination of the foregoing.

The in-trench capacitor segments 106 may have greater coefficients of thermal expansion than the substrate segments 110, such that the in-trench capacitor segments 106 may expand by a greater amount than the substrate segments 110 during high temperature processes and/or high voltage processes. As a result, the in-trench capacitor segments 106 may apply stress on the substrate segments 110. The stress is neutral at a center of the trench capacitor 102 due to symmetry in the trench capacitor 102. However, the stress increases from the center of the trench capacitor 102 to edges of the trench capacitor 102 along the axis A.

Because the substrate widths $W_s$ increase from the center of the trench capacitor 102 to the edges of the trench capacitor 102, the substrate segments 110 increase in rigidity from the center of the trench capacitor 102 to the edges of the trench capacitor 102. As a result, the substrate segments 110 increase in strength as thermal expansion stress increases. This reduces the likelihood of the substrate segments 110 bending and further reduces the likelihood of trench burnout. Because the capacitor widths $W_c$ increase from the center of the trench capacitor 102 to the edges of the trench capacitor 102, the gaps 108 of the in-trench capacitor segments 106 increase from the center of the trench capacitor 102 to the edges of the trench capacitor 102. The gaps 108 facilitate stress absorption, and the increasing size of the gaps 108 provides increasing stress absorption as thermal expansion stress increases. As a result, the substrate segments 110 are less prone to bending and trench burnout at the in-trench capacitor segments 106 is reduced. Because the increasing capacitor widths $W_c$ and the increasing substrate widths $W_s$ reduce substrate bending and trench burnout, bulk manufacturing yields may be increased.

Figure 8:
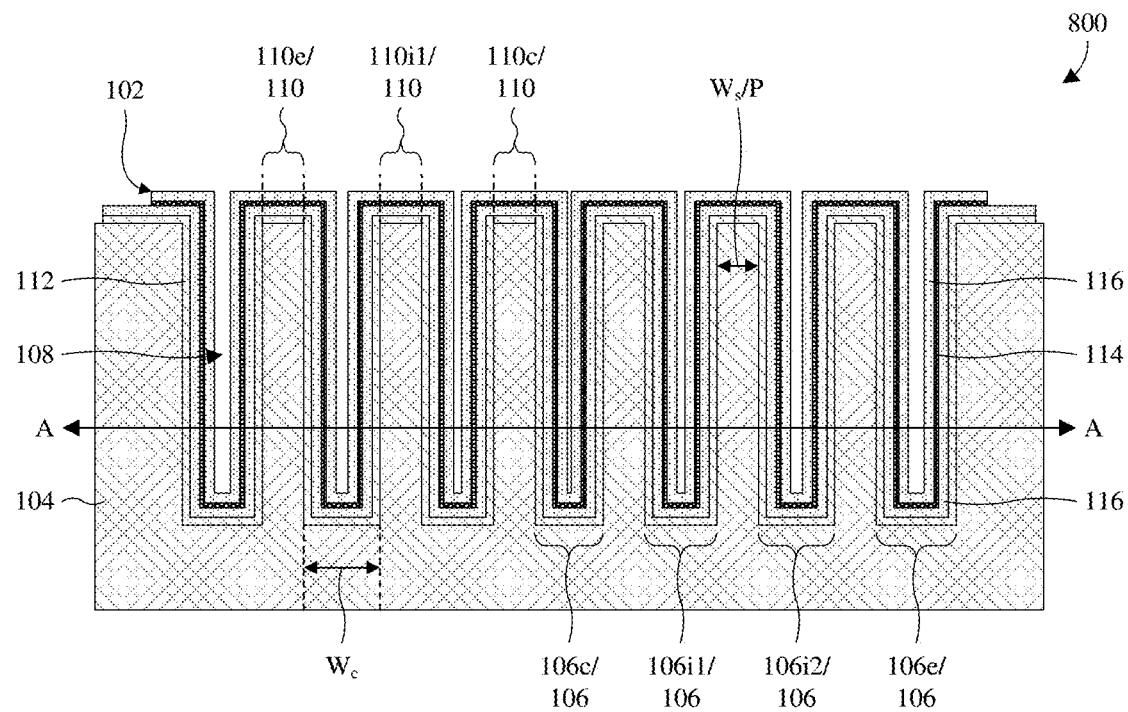

With reference to FIG. 8, a cross-sectional view 800 of some alternative embodiments of the trench capacitor 102 of FIG. 7 is provided in which the substrate widths $W_s$ are the same. In other words, the pitch P is uniform from a center of the trench capacitor 102 to edges of the trench capacitor 102. Further, the capacitor widths $W_c$ persist at increasing gradually from the center of the trench capacitor 102 to the edges of the trench capacitor 102 for enhanced stress absorption as stress increases. As described above, this may mitigate substrate bending and/or trench burnout and may hence increase bulk manufacturing yields.

Figure 9:
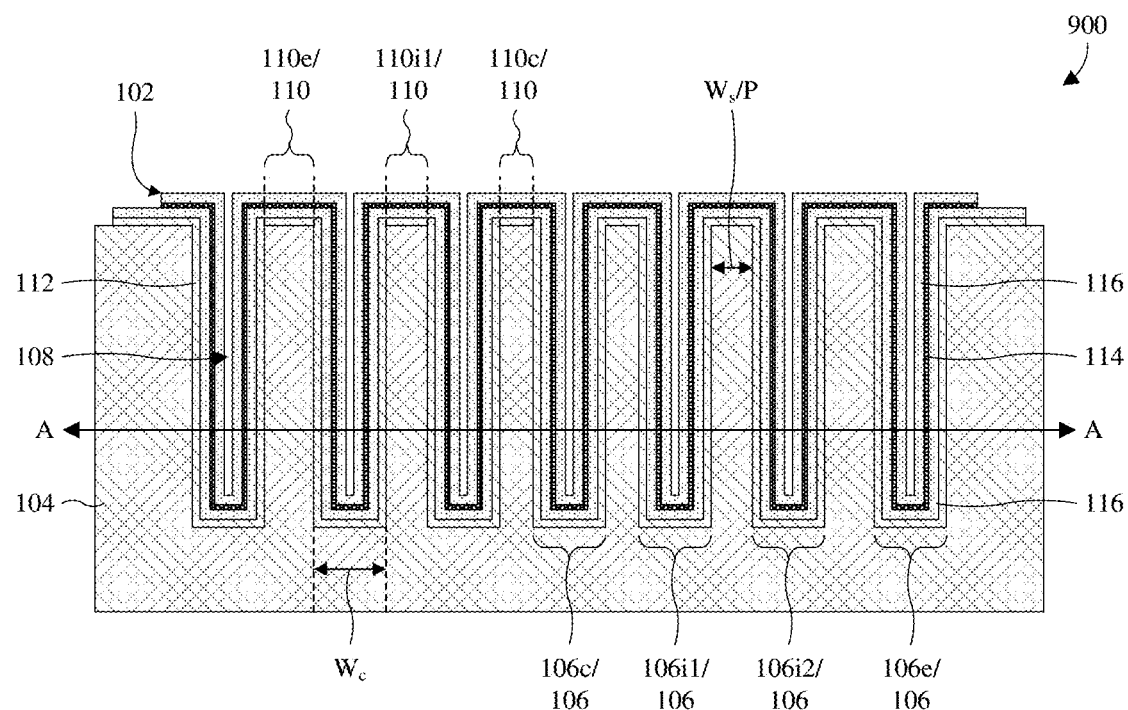

With reference to FIG. 9, a cross-sectional view 900 of some alternative embodiments of the trench capacitor 102 of FIG. 7 is provided in which the capacitor widths $W_c$ are the same. However, the substrate widths $W_s$ persist at increasing gradually from the center of the trench capacitor 102 to the edges of the trench capacitor 102 for enhanced rigidity as stress increases. As described above, this may mitigate substrate bending and/or trench burnout and may hence increase bulk manufacturing yields.

Figure 10:
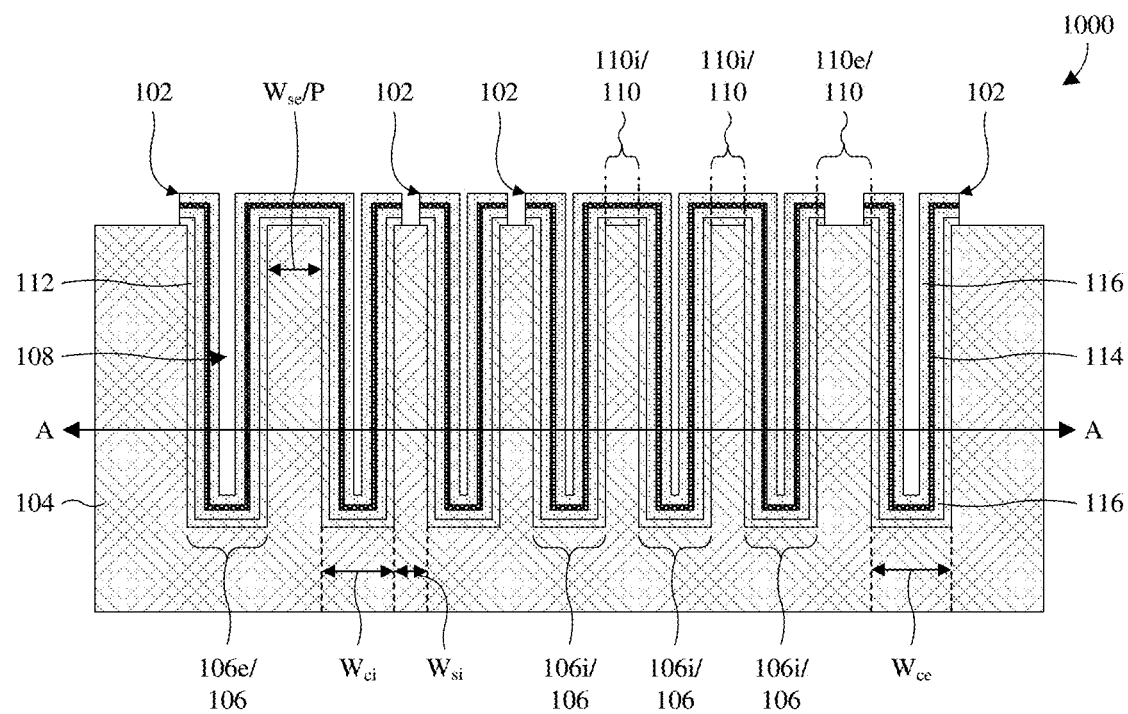
FIG. 10 illustrates a cross-sectional view of some alternative embodiments of FIG. 2 in which the trench capacitor is replaced with a plurality of trench capacitors spread across the in-trench capacitor segments.

With reference to FIG. 10, a cross-sectional view 1000 of some alternative embodiments of FIG. 2 is provided in which the trench capacitor 102 is replaced with a plurality of trench capacitors 102 spread across the in-trench capacitor segments 106. From left to right, the trench capacitors 102 respectively comprise two in-trench capacitor segments, one in-trench capacitor segment, three in-trench capacitor segments, and one in-trench capacitor segment. In alternative embodiments, more or less trench capacitors are spread across the in-trench capacitor segments 106. Further, in alternative embodiments, the trench capacitors 102 comprise different numbers of in-trench capacitor segments.

Figure 11:
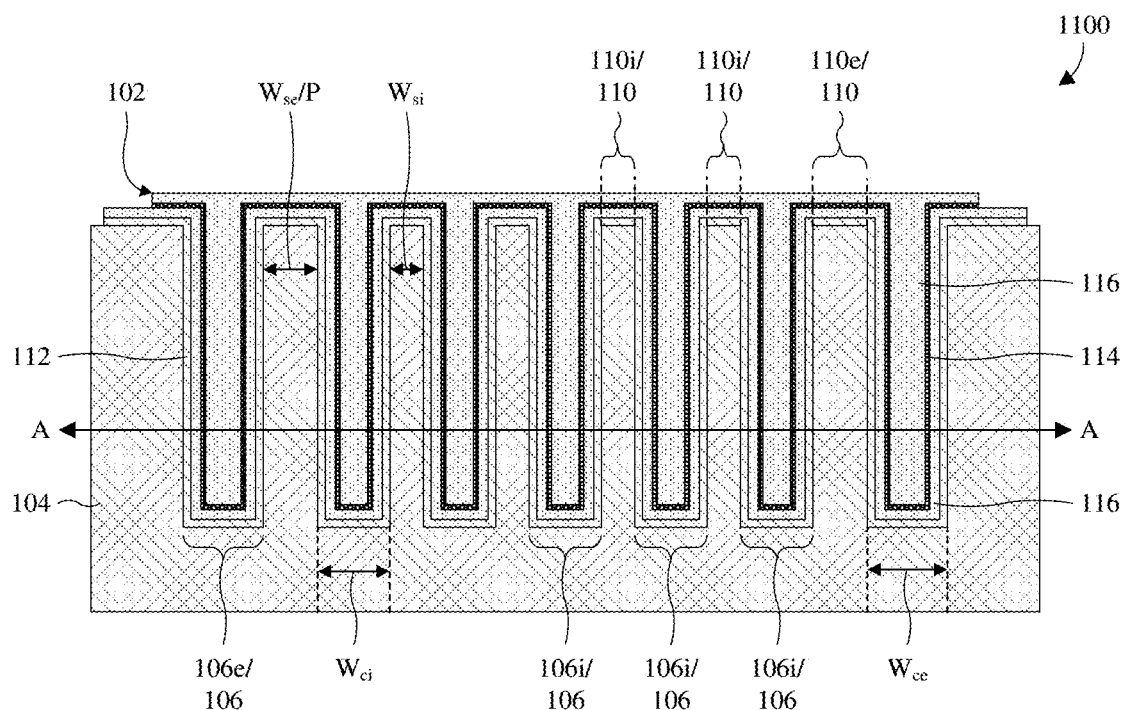
FIGS. 11-15 illustrates cross-sectional views of some alternative embodiments of the trench capacitor of FIG. 2 in which features are removed or added.

With reference to FIG. 11, a cross-sectional view 1100 of some alternative embodiments of the trench capacitor 102 of FIG. 2 is provided in which the gaps 108 are removed from the edge in-trench capacitor segments 106e and the interior in-trench capacitor segments 106i.

Figure 12:
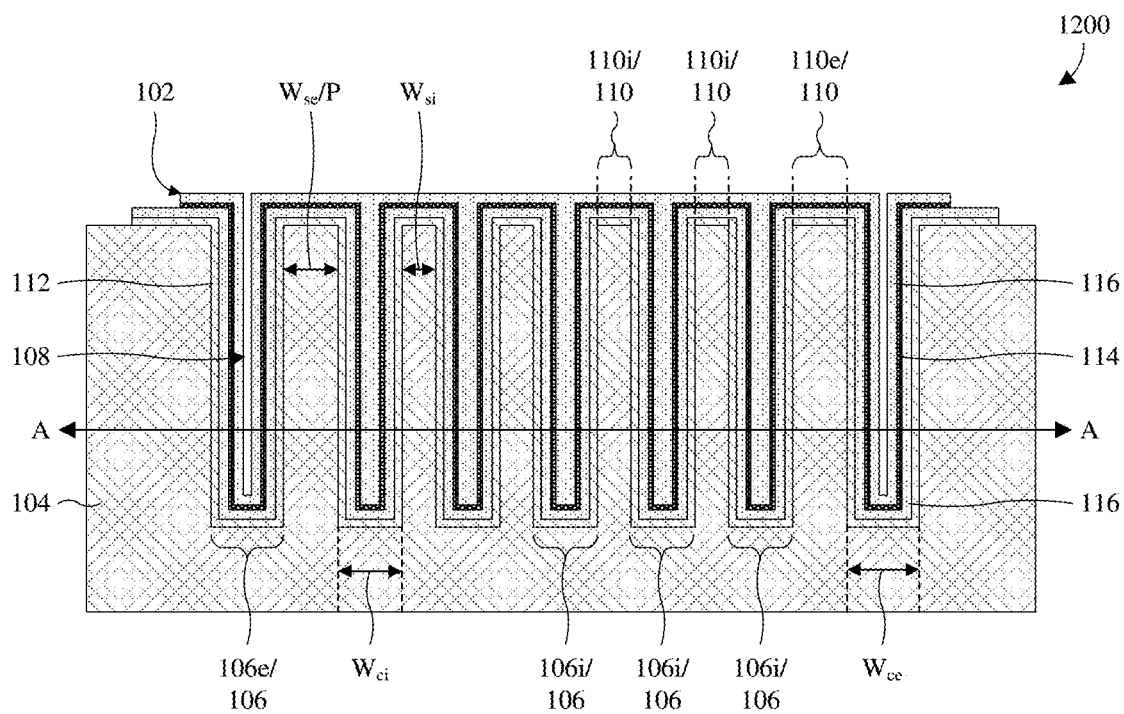

With reference to FIG. 12, a cross-sectional view 1200 of some alternative embodiments of the trench capacitor 102 of FIG. 2 is provided in which the gaps 108 are removed from the interior in-trench capacitor segments 106i but persist at the edge in-trench capacitor segments 106e. The gaps 108 at the edge in-trench capacitor segments 106e facilitate stress absorption at the edge of the trench capacitor 102 where stress is greatest.

Figure 13:
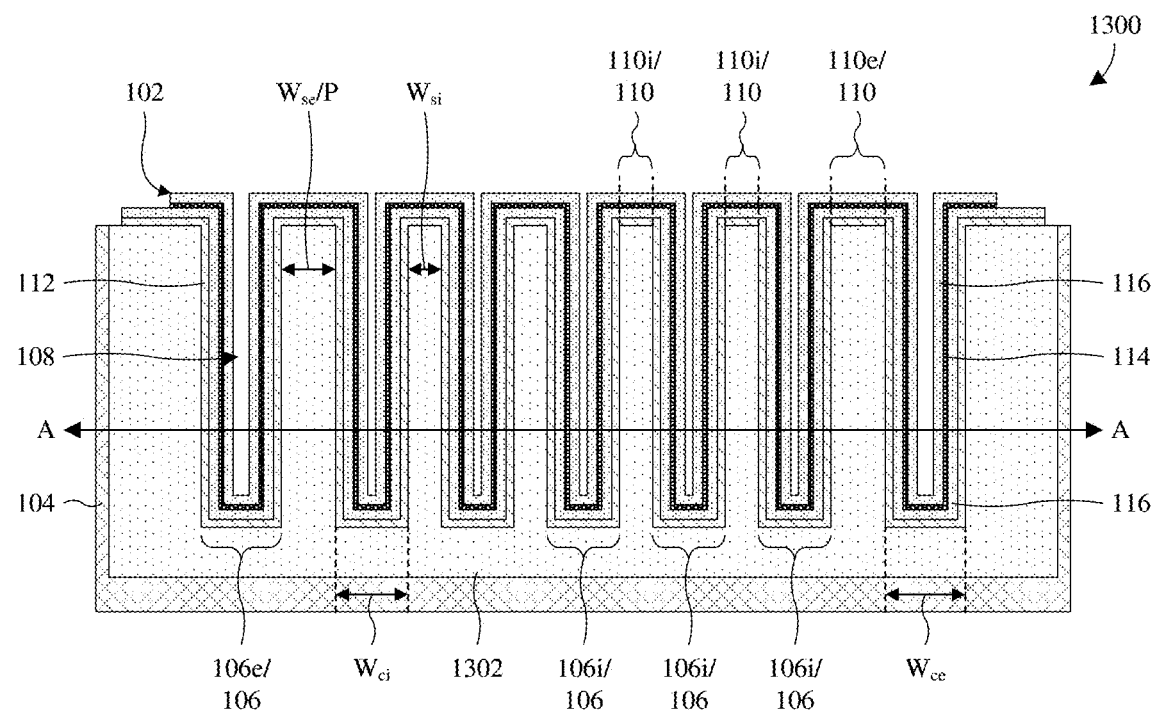

With reference to FIG. 13, a cross-sectional view 1300 of some alternative embodiments of the trench capacitor 102 of FIG. 2 is provided in which the trench capacitor 102 further comprises a doped well 1302. The doped well 1302 corresponds to a doped semiconductor region of the substrate 104 with a P-type or N-type doping. The doped well 1302 may then be employed as an additional capacitor electrode to increase capacitance density. For example, the doped well 1302, the dielectric liner layer 112, and the bottom one of the capacitor electrodes 116 may define a first capacitor, whereas the capacitor electrodes 116 and the capacitor dielectric layer 114 may define a second capacitor. By electrically coupling the doped well 1302 and the top one of the capacitor electrodes 116 to a first terminal of the trench capacitor 102, and by electrically coupling the bottom one of the capacitor electrodes 116 to a second terminal of the trench capacitor 102, the first and second capacitors are electrically coupled in parallel. As such, a capacitance of the trench capacitor 102 is a summation of the individual capacitances of the first and second capacitors.

Figure 14:
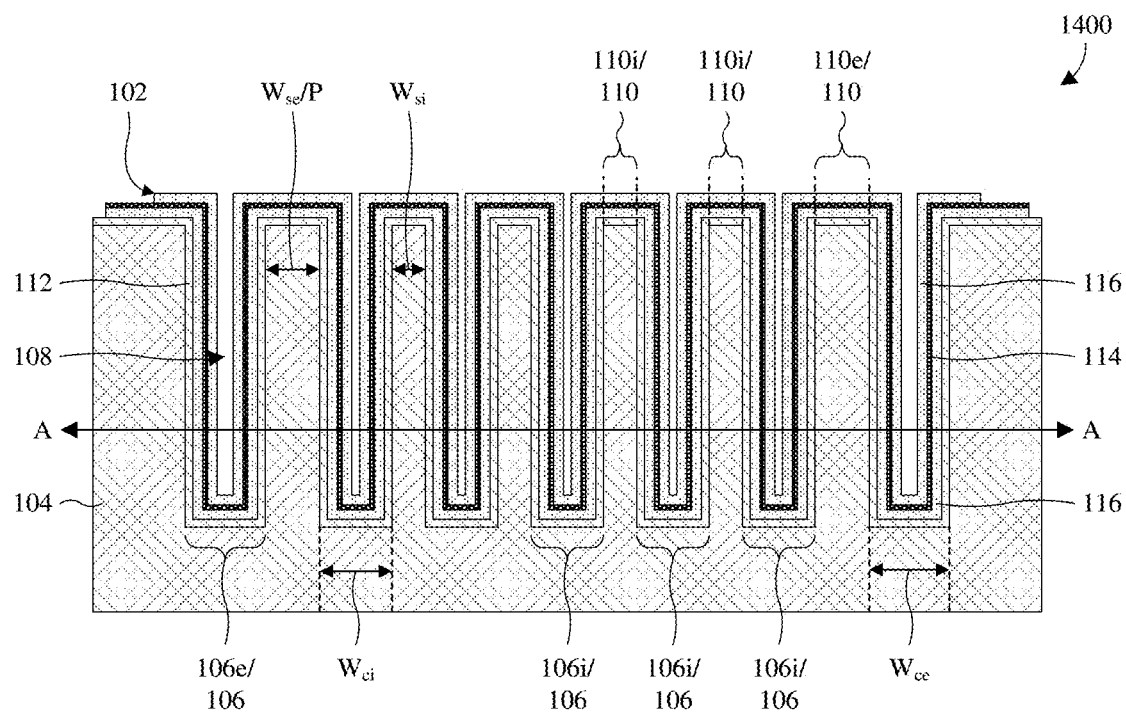

With reference to FIG. 14, a cross-sectional view 1400 of some alternative embodiments of the trench capacitor 102 of FIG. 2 is provided in which the dielectric liner layer 112 blankets a top of the substrate 104 with a larger width than the capacitor electrodes 116 and the capacitor dielectric layer 114. Further, the capacitor dielectric layer 114 and a bottom one of the capacitor electrodes 116 share a common width.

Figure 15:
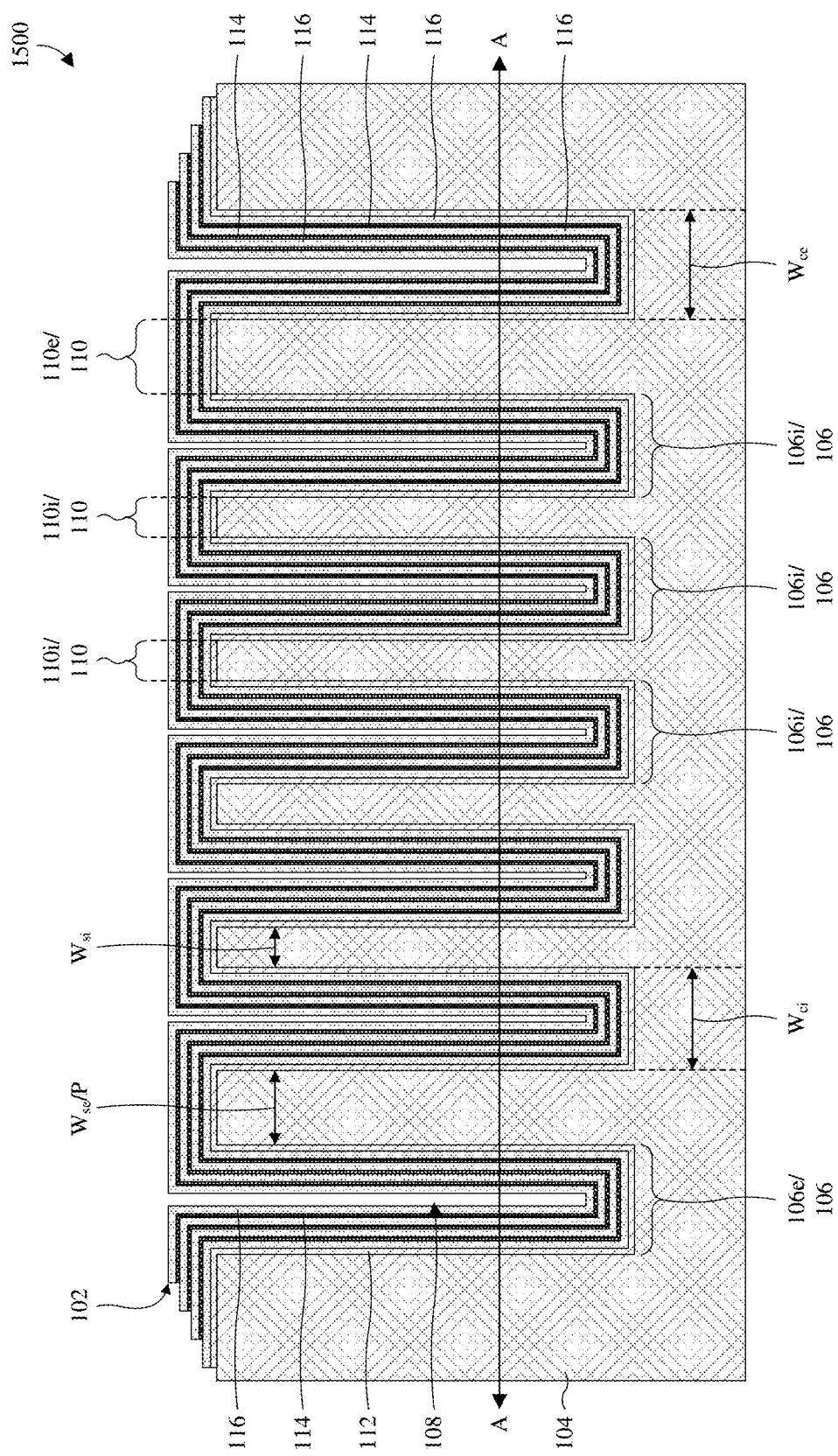

With reference to FIG. 15, a cross-sectional view 1500 of some alternative embodiments of the trench capacitor 102 of FIG. 2 is provided in which the trench capacitor 102 comprises additional capacitor electrodes 116 and additional capacitor dielectric layers 114. For example, instead of two capacitor electrodes 116 and one capacitor dielectric layer 114, the trench capacitor 102 may comprise four capacitor electrodes 116 and three capacitor dielectric layers 114. In other embodiments, the trench capacitor 102 may have M capacitor electrodes 116 and M−1 capacitor dielectric layers 114, where M is an integer variable greater than one.

The capacitor electrodes 116 and the capacitor dielectric layers 114 are as their counterparts are described in FIG. 2. Further, the capacitor electrodes 116 and the capacitor dielectric layers 114 are alternatingly stacked over the dielectric liner layer 112. The capacitor electrodes 116 and the capacitor dielectric layers 114 have widths decreasing from a bottom of the trench capacitor 102 to a top of the trench capacitor 102. Further, each capacitor dielectric layer has a substantially same width as an immediately overlying capacitor electrode in some embodiments. In other embodiments, each capacitor dielectric layer has a substantially same width as an immediately underlying capacitor electrode.

While FIGS. 3 and 4A-4E describe top layouts of the in-trench capacitor segments 106 with regard to FIG. 2, it is to be appreciated that the top layouts are applicable to any of FIGS. 5-15. For example, the in-trench capacitor segments 106 of FIG. 7 may be arranged in a serpentine trench pattern as described with regard to FIG. 4B. While FIGS. 5-9 describe variations to FIG. 2 in which the trench pattern is varied, it is to be appreciated that the variations are applicable to any of FIGS. 3, 4A-4E, and 10-15. While FIG. 10 describes a variation to FIG. 2 in which the trench capacitor 102 is replaced with multiple trench capacitors 102, it is to be appreciated that this variation is applicable to any of FIGS. 3, 4A-4E, 5-9, and 11-15. While FIGS. 11-15 describe variations to FIG. 2 in which features are removed or added, it is to be appreciated that any one or combination of the variations are applicable to any of FIGS. 3, 4A-4E, and 5-10. For example, the gaps 108 may be removed from FIG. 5 as described with regard to FIG. 11.

Figure 16:
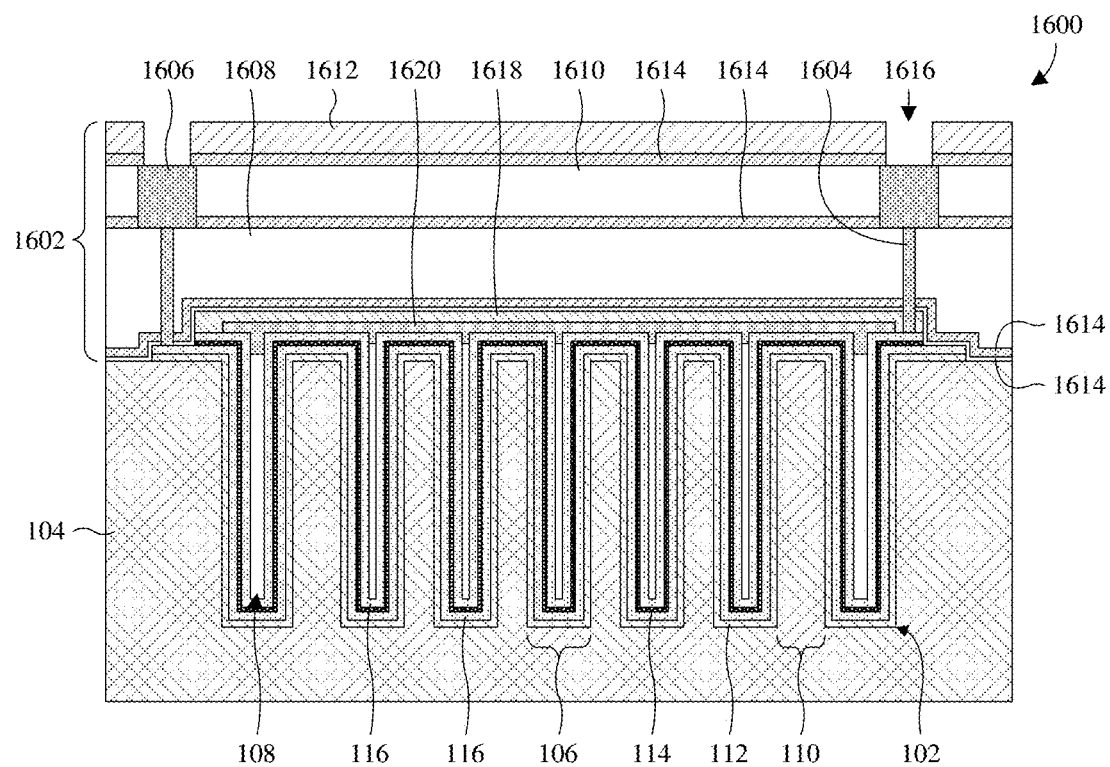
FIG. 16 illustrates a cross-sectional view of some embodiments of an integrated passive device (IPD) package comprising the trench capacitor of FIG. 2.

With reference to FIG. 16, a cross-sectional view 1600 of some embodiments of an IPD package comprising the trench capacitor 102 of FIG. 2 is provided. An interconnect structure 1602 overlies and is electrically coupled to the trench capacitor 102. The interconnect structure 1602 comprises a plurality of contacts 1604 and a plurality of wires 1606. The contacts 1604 and the wires 1606 correspond to the capacitor electrodes 116, and the contacts 1604 extend respectively from the wires 1606 respectively to the capacitor electrodes 116. The contacts 1604 and the wires 1606 are or comprise metal and/or some other suitable conductive material(s). In alternative embodiments, a plurality of additional wires and a plurality of vias are alternatingly stacked over and electrically coupled to the contacts 1604.

A dielectric structure surrounds the contacts 1604 and the wires 1606. The dielectric structure comprises an interlayer dielectric (ILD) layer 1608, an intermetal dielectric (IMD) layer 1610, a passivation layer 1612, and a plurality of etch stop layers 1614. The passivation layer 1612 overlies the IMD layer 1610 and the wires 1606 and is separated from the IMD layer 1610 by a corresponding one of the etch stop layers 1614. Further, the passivation layer 1612 defines openings 1616 individual to and respectively exposing the wires 1606. The IMD layer 1610 surrounds the wires 1606 over the ILD layer 1608 and the contacts 1604. Further, the IMD layer 1610 is separated from the ILD layer 1608 by a corresponding one of the etch stop layers 1614. The ILD layer 1608 surrounds the contacts 1604 over the trench capacitor 102. Further the ILD layer 1608 is separated from the trench capacitor 102 by corresponding ones of the etch stop layers 1614. The etch stop layers 1614 are dielectric and each may be a different material type than an immediately overlying dielectric layer. For example, a top one of the etch stop layers 1614 is a different material type than the passivation layer 1612.

A hard mask 1618 and a cap structure 1620 underlie the dielectric structure and are localized on a top one of the capacitor electrodes 116. The cap structure 1620 is between the hard mask 1618 and partially fills the gaps 108 of the trench capacitor 102. In alternative embodiments, the cap structure 1620 fully fills the gaps 108.

In some embodiments, the cap structure 1620 is dielectric. For example, the cap structure 1620 may be silicon oxide and/or some other suitable dielectric(s). In other embodiments, the cap structure 1620 is conductive. For example, the cap structure 1620 may be or comprise pure/elemental titanium, some other suitable metal(s), a metallic material, titanium nitride, tantalum nitride, some other suitable metal nitride(s), some other suitable conductive material(s), or any combination of the foregoing. In some embodiments, the hard mask 1618 is or comprises silicon nitride, silicon oxide, a polymer, a bottom anti-reflective coating (BARC), some other suitable hard mask material(s), or any combination of the foregoing.

Figure 17:
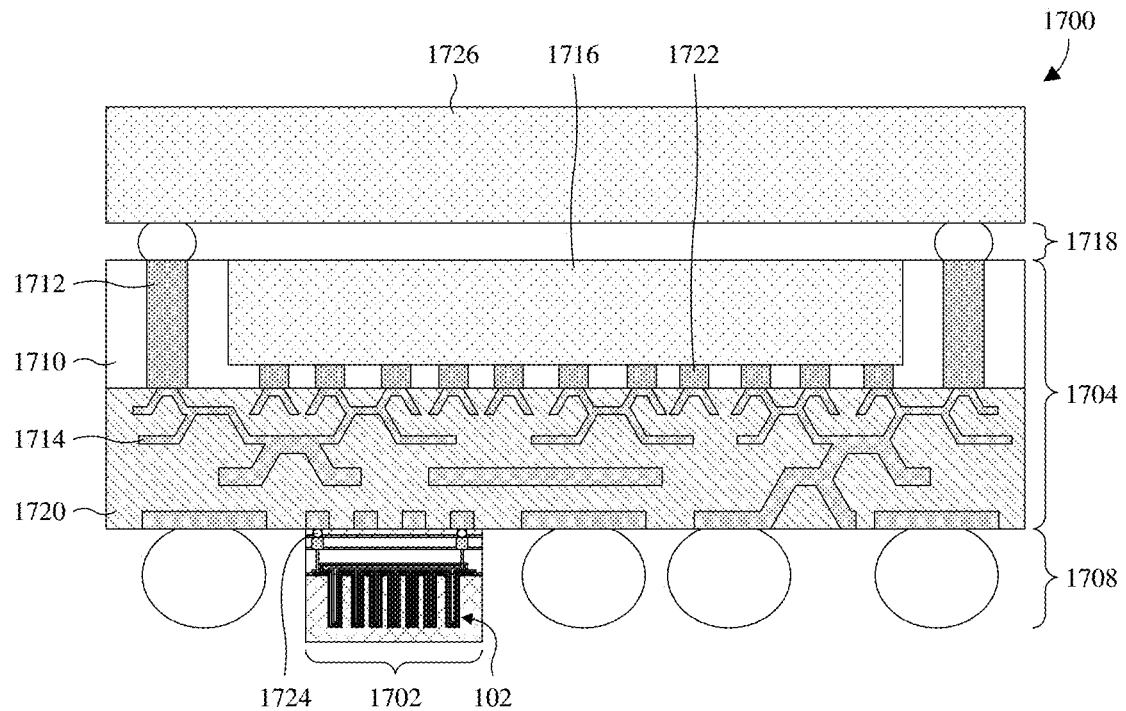
FIG. 17 illustrates a cross-sectional view of some embodiments of an integrated fan-out package on package (InFO-PoP) structure comprising the IPD package of FIG. 16.

With reference to FIG. 17, a cross-sectional view 1700 of some embodiments of an integrated fan-out package on package (InFO-PoP) structure comprising the IPD package of FIG. 16 (hereafter labeled 1702) is provided. The IPD package 1702 is on an underside of an integrated fan-out structure 1704 with a first bump array 1708. As a result, the trench capacitor 102 of the IPD package 1702 may also be referred to as a land-side capacitor (LSC).

The integrated fan-out structure 1704 comprises a molding compound 1710, through vias 1712, and a plurality of redistribution layers (RDLs) 1714. The molding compound 1710 is adjacent to a first IC chip package 1716 on sidewalls of the first IC chip package 1716, and the RDLs 1714 are between the first bump array 1708 and the first IC chip package 1716. The first IC chip package 1716 may, for example, be system on a chip (SoC) package or some other suitable type of IC chip package. The through vias 1712 extend through the molding compound 1710 from corresponding RDLs to a second bump array 1718 on an upper side of the integrated fan-out structure 1704. The RDLs 1714 are in a fan-out dielectric layer 1720 and define conductive paths interconnecting the first bump array 1708, the through vias 1712, pads 1722 of the first IC chip package 1716, and the IPD package 1702. The IPD package 1702 may, for example, be electrically coupled to corresponding RDLs by a conductive material 1724.

A second IC chip package 1726 overlies and is electrically coupled to the integrated fan-out structure 1704 through the second bump array 1718. The second IC chip package 1726 has a larger size than the first IC chip package 1716 and may, for example, be a DRAM chip package, some other suitable type of memory chip package, or some other suitable type of IC chip package.

Figure 18:
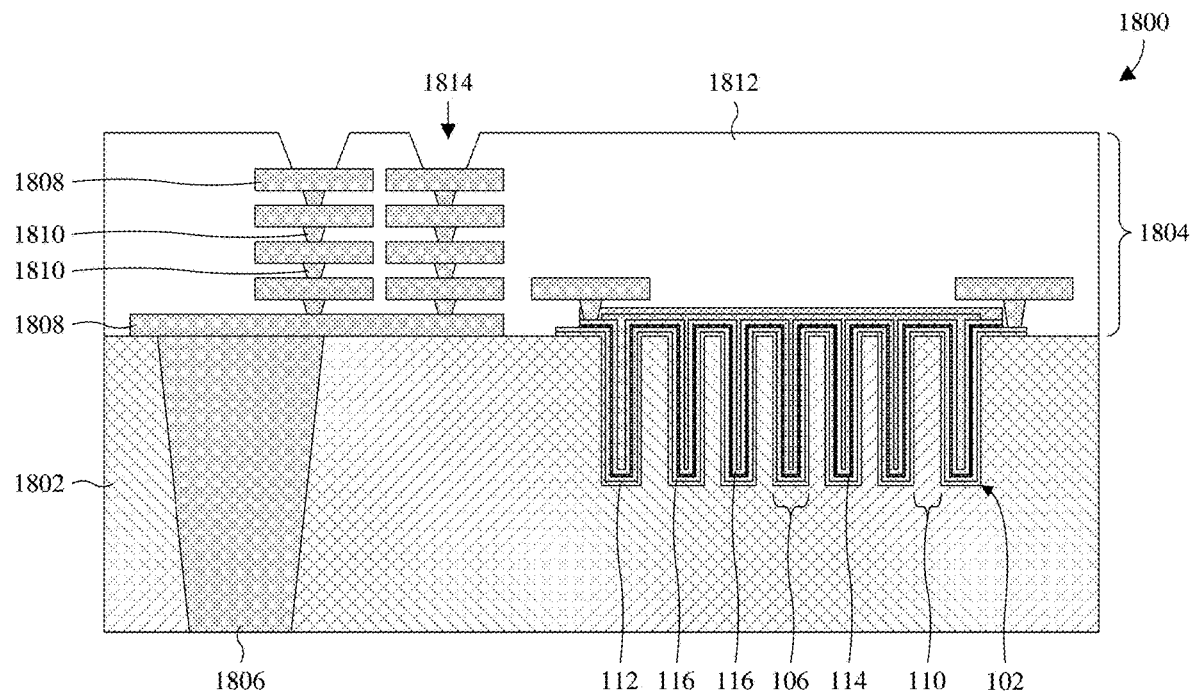
FIG. 18 illustrates a cross-sectional view of some embodiments of an interposer comprising the trench capacitor of FIG. 2.

With reference to FIG. 18, a cross-sectional view 1800 of some embodiments of an interposer comprising the trench capacitor 102 of FIG. 2 is provided. The interposer comprises an interposer substrate 1802, an interposer interconnect structure 1804, and a through substrate via (TSV) 1806. The interposer substrate 1802 accommodates the TSV 1806 and the trench capacitor 102. Further, the interposer substrate 1802 underlies the interposer interconnect structure 1804. The interposer substrate 1802 may, for example, be or comprise a bulk silicon substrate or some other suitable type of substrate.

The interposer interconnect structure 1804 overlies and is electrically coupled to the TSV 1806 and the trench capacitor 102. The interposer interconnect structure 1804 comprises a plurality of wires 1808 and a plurality of vias 1810. The wires 1808 and the vias 1810 are alternatingly stacked to define conductive paths leading from the TSV 1806 and the trench capacitor 102. Further, the wires 1808 and the vias 1810 are alternatingly stacked in an interposer dielectric layer 1812. The interposer dielectric layer 1812 defines openings 1814 individual to and respectively exposing top wires of the interposer interconnect structure 1804.

Figure 19:
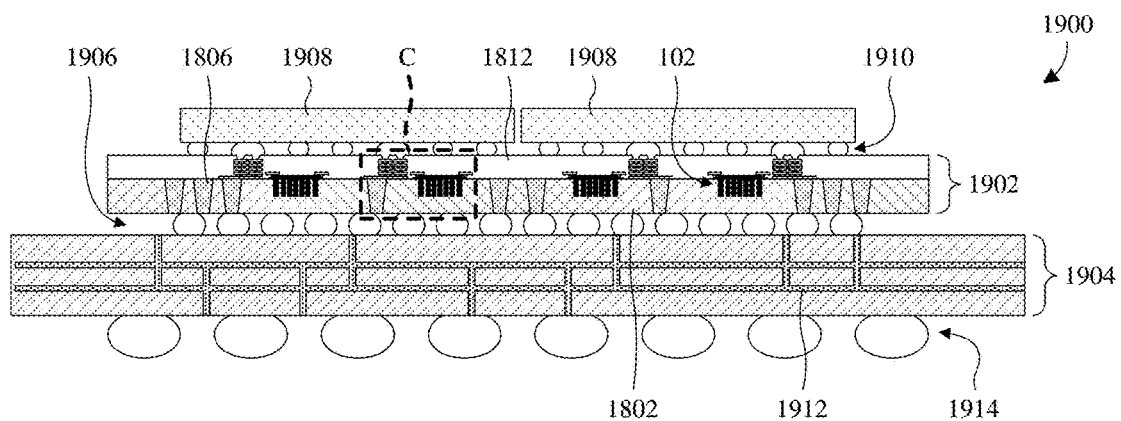
FIG. 19 illustrates a chip-on-wafer-on-substrate (CoWoS) package comprising the interposer of FIG. 18.

With reference to FIG. 19, a cross-sectional view 1900 of some embodiments of a chip-on-wafer-on-substrate (CoWoS) package comprising the interposer of FIG. 18 (hereafter labeled 1902) is provided. Note that FIG. 19 provides an expanded view of the interposer 1902 in which the interposer 1902 comprises a plurality of TSVs 1806 and a plurality of trench capacitors 102. FIG. 18 may, for example, correspond to a portion of the interposer 1902 within box C.

The interposer 1902 overlies and is electrically coupled to a package substrate 1904 by a first bump array 1906. Further, the interposer 1902 underlies and is electrically coupled to a pair of IC chip packages 1908 by a second bump array 1910. The IC chip packages 1908 may, for example, correspond to a SoC package and a DRAM package. Alternatively, one or both of the IC chip packages 1908 may correspond to other suitable types of IC packages. The package substrate 1904 comprises a plurality conductive traces 1912 defining conductive paths from the first bump array 1906 to a third bump array 1914 on an underside of the package substrate 1904.

While FIGS. 16-19 are illustrated using embodiments of the trench capacitor 102 in FIG. 2, embodiments of the trench capacitor 102 in any of FIGS. 5-15 may alternatively be used. In other words, the trench capacitor 102 in any of FIGS. 16-19 may be replaced with the trench capacitor 102 in any of FIGS. 5-15.

With reference to FIGS. 20-31, a series of cross-sectional views 2000-3100 of some embodiments of a method for forming a trench capacitor with a trench pattern for yield improvement is provided. The method is illustrated using embodiments of the trench capacitor in FIG. 15. However, the method may also be used to form embodiments of the trench capacitor in any of FIGS. 1, 2, 3, 4A-4E, and 5-14 or other suitable embodiments of the trench capacitor.

Figure 20:
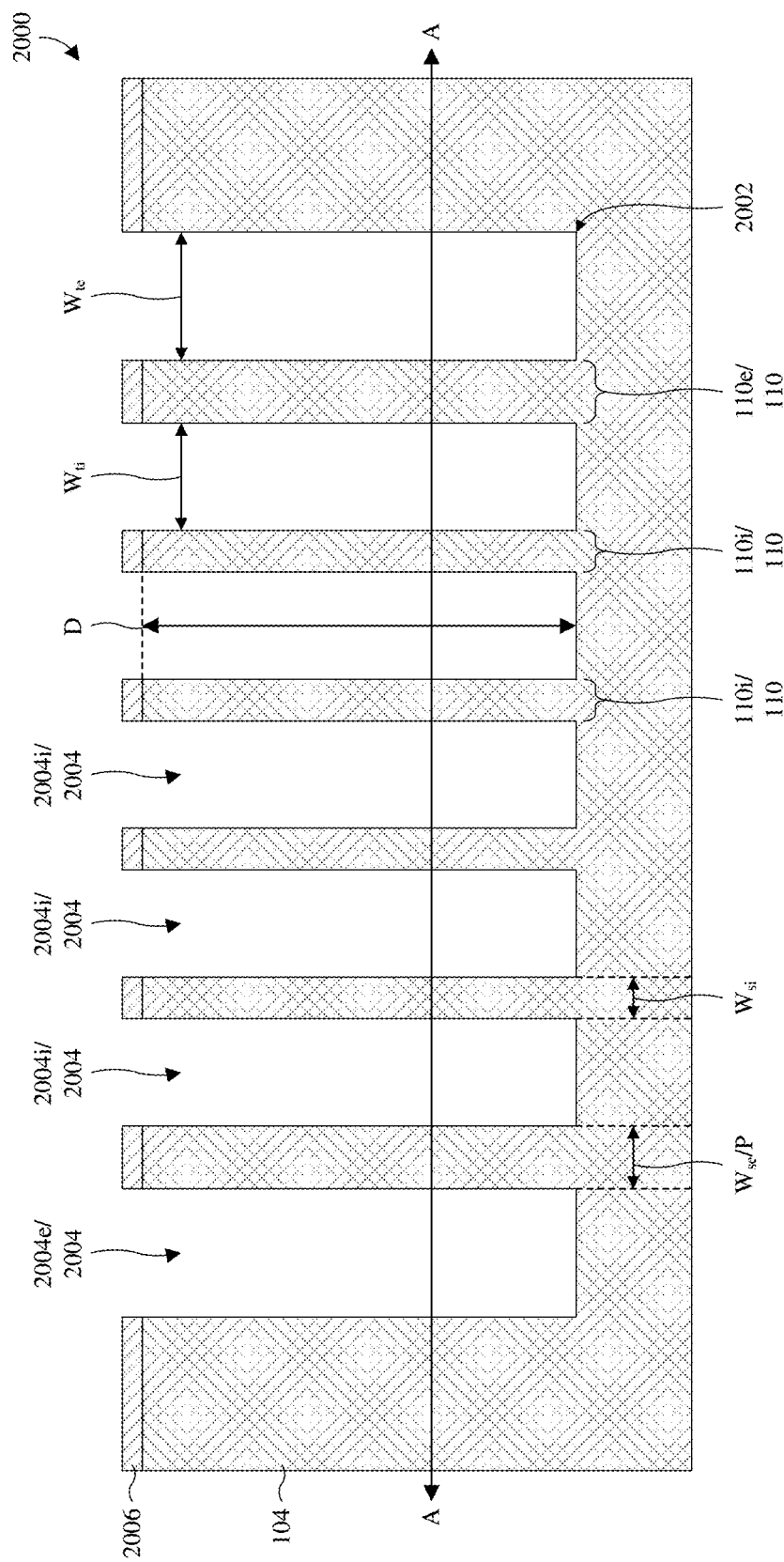
FIGS. 20-31 illustrate a series of cross-sectional views of some embodiments of a method for forming a trench capacitor with a trench pattern for yield improvement.

As illustrated by the cross-sectional view 2000 of FIG. 20, a substrate 104 is patterned with a trench pattern 2002 to form a plurality of trench segments 2004 and a plurality of substrate segments 110. In some embodiments, the trench segments 2004 are disconnected outside the cross-sectional view 2000 and may be regarded as independent trenches. In other embodiments, the trench segments 2004 are connected outside the cross-sectional view 2000 and may be regarded as portions of a common trench. The substrate 104 may, for example, be a bulk silicon substrate, a bulk oxide substrate, or some other suitable type of substrate.

In some embodiments, a process for patterning the substrate 104 comprises: 1) forming a hard mask 2006 over the substrate 104 and with the trench pattern 2002; and 2) performing an etch into the substrate 104 with the hard mask 2006 in place. Other processes are, however, amenable for patterning the substrate 104. In some embodiments, a process for forming the hard mask 2006 comprises: 1) depositing a hard mask layer over the substrate 104; 2) forming a photoresist mask over the hard mask layer using photolithography; 3) performing an etch into the hard mask layer with the photoresist mask in place; and 4) removing the photoresist mask after the etch. Other processes are, however, amenable for forming the hard mask 2006.

The trench segments 2004 are laterally separated with a pitch P along an axis A and extend into a top of the substrate 104. In some embodiments, the trench segments 2004 extend into the substrate 104 to a depth D that is about 1-30 micrometers, about 1-15 micrometers, about 15-30 nanometers, or some other suitable value(s). Similar to the trench segments 2004, the substrate segments 110 are laterally separated along the axis A. Further, the substrate segments 110 protrude or otherwise extend upward between the trench segments 2004 to separate the trench segments 2004. For example, the trench segments in each pair of neighboring trench segments may be separated by a corresponding substrate segment.

In some embodiments, a top layout of the trench pattern 2002 is as in any of FIGS. 3 and 4A-4E. As should be appreciated, the trench pattern 2002 corresponds to the area occupied by the trench capacitor 102 in FIGS. 3 and 4A-4E. Therefore, the trench pattern 2002 may, for example, have a plurality of parallel lines as shown in FIG. 3. As another example, the trench pattern 2002 may be serpentine or grid shaped as respectively shown in FIGS. 4B and 4E.

The plurality of trench segments 2004 comprises a pair of edge trench segments 2004e and a plurality of interior trench segments 2004i. The edge trench segments 2004e are respectively on opposite edges of the trench pattern 2002, and the interior trench segments 2004i are between the edge trench segments 2004e. The edge trench segments 2004e have individual trench edge widths $W_{te}$, and the interior trench segments 2004i have individual trench interior widths $W_{ti}$ less than the trench edge widths $W_{te}$. The trench edge widths $W_{te}$ are the same and the trench interior widths $W_{ti}$ are the same. In other embodiments, the trench edge widths $W_{ie}$ are different and/or the trench interior widths $W_{ti}$ are different. For example, the trench interior widths $W_{ti}$ may gradually increase from a center of the trench pattern 2002 to the edges of the trench pattern 2002. FIGS. 7 and 8 provide examples of this gradual increase in which the trench pattern 2002 corresponds to the area occupied by the in-trench capacitor segments 106.

The plurality of substrate segments 110 comprises a pair of edge substrate segments 110e and a plurality of interior substrate segments 110i. The edge substrate segments 110e are between and respectively border the edge in-trench capacitor segments 106e, and the interior substrate segments 110i are between the edge substrate segments 110e. The edge substrate segments 110e have individual substrate edge widths $W_{se}$, and the interior substrate segments 110i have individual substrate interior widths $W_{si}$ less than the substrate edge widths $W_{se}$. The substrate edge widths $W_{se}$ are the same and the substrate interior widths $W_{si}$ are the same. In other embodiments, the substrate edge widths $W_{se}$ are different and/or the substrate interior widths $W_{si}$ are different. For example, the substrate interior widths $W_{si}$ may gradually increase from a center of the trench pattern 2002 to the edges of the trench pattern 2002. FIGS. 7 and 9 provide examples of this gradual increase in which the trench pattern 2002 corresponds to the area occupied by the in-trench capacitor segments 106. Because the substrate edge widths $W_{se}$ are greater than the substrate interior widths $W_{si}$, the pitch P is greater at the edge substrate segments 110e than at the interior substrate segments 110i. The pitch P is the same at the edge substrate segments 110e and is the same at the interior substrate segments 110i. In other embodiments, the pitch P is different at the edge substrate segments 110e and/or is different at the interior substrate segments 110i.

As described above, the trench pattern 2002 is such that the substrate edge widths $W_{se}$ are greater than the substrate interior widths $W_{si}$ and the trench edge widths $W_{te}$ are greater than the trench interior widths $W_{ti}$. However, in alternative embodiments, the substrate edge widths $W_{se}$ are the same as the substrate interior widths $W_{si}$ or the trench edge widths $W_{ie}$ are the same as the trench interior widths $W_{ti}$. FIGS. 5 and 6 provide non-limiting examples in which the trench pattern 2002 corresponds to the area occupied by the in-trench capacitor segments 106.

Figure 21:
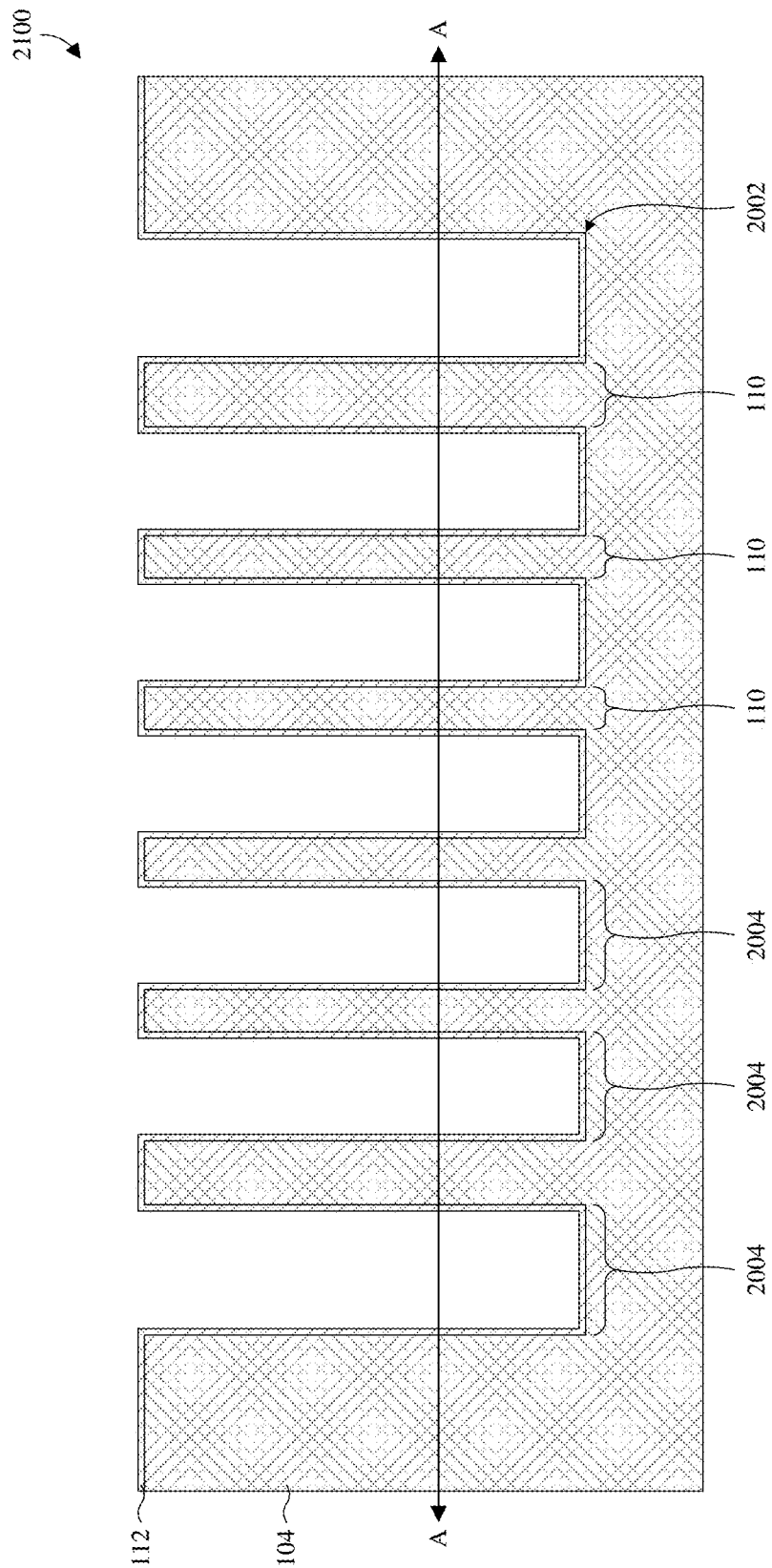

As illustrated by the cross-sectional view 2100 of FIG. 21, the hard mask 2006 (see, e.g., FIG. 20) is removed. The removal may, for example, be performed by an etching process or some other suitable removal process.

Also illustrated by the cross-sectional view 2100 of FIG. 21, a dielectric liner layer 112 is deposited covering the substrate 104 and further lining and partially filling the trench segments 2004. In some embodiments, the dielectric liner layer 112 is or comprises silicon oxide, a high k dielectric, some other suitable dielectric(s), or any combination of the foregoing. The dielectric liner layer 112 may, for example, be formed by vapor deposition, thermal oxidation, some other suitable deposition process(es), or any combination of the foregoing.

Figure 22:
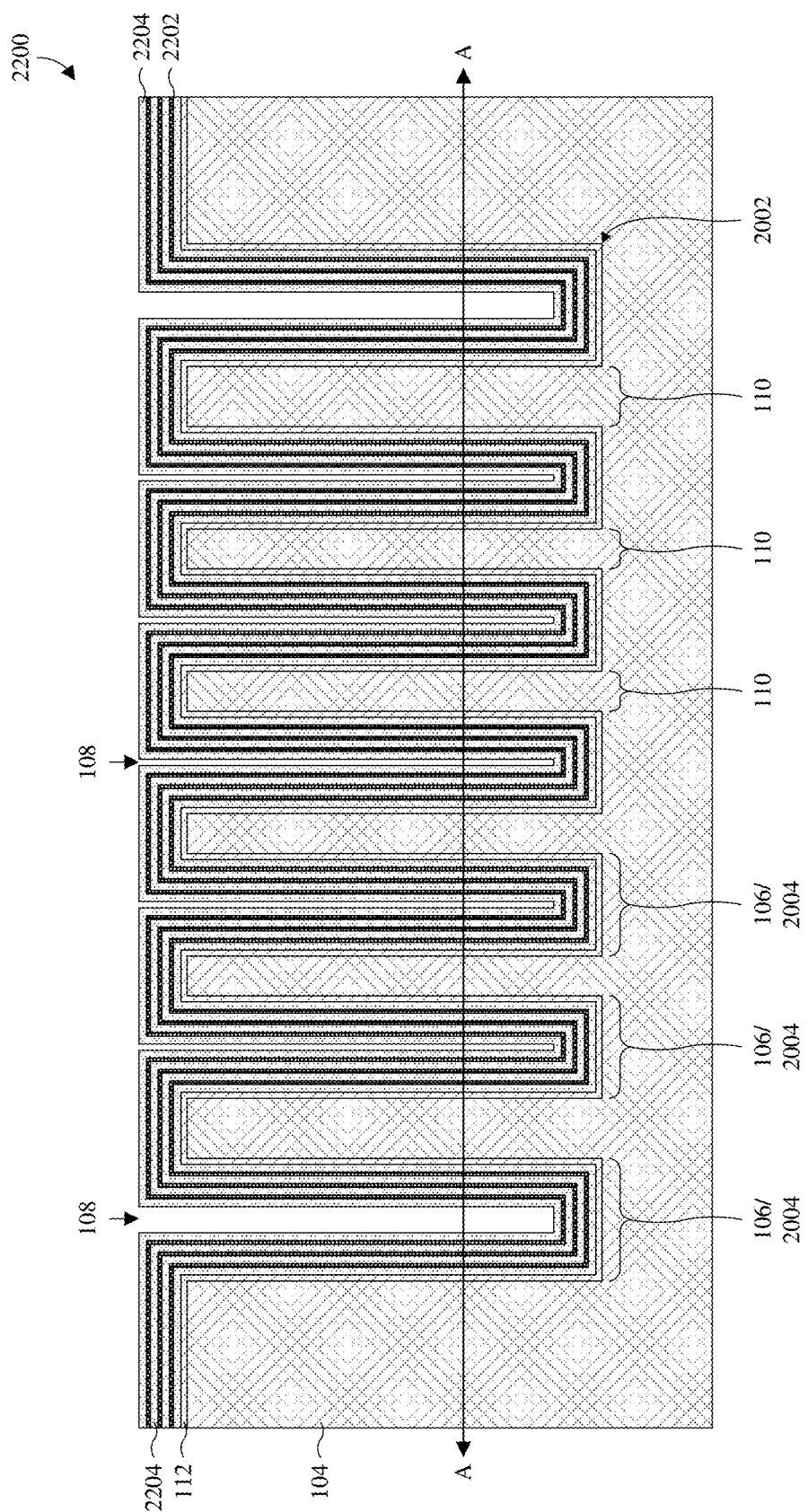

As illustrated by the cross-sectional view 2200 of FIG. 22, a plurality of electrode dielectric layers 2202 and a plurality of electrode layers 2204 are deposited. The electrode dielectric layers 2202 and the electrode layers 2204 are deposited alternatingly stacked over the dielectric liner layer 112. Further, the electrode dielectric layers 2202 and the electrode layers 2204 are deposited lining and partially filling a remainder of the trench segments 2004. Because the electrode dielectric layers 2202 and the electrode layers 2204 partially fill the remainder of the trench segments 2004, gaps 108 persist at the trench segments 2004. The gaps 108 correspond to unfilled portions of the trench segments 2004 and may, for example, also be known as air gaps, voids, cavities, or some other suitable name(s). The electrode dielectric layers 2202 and the electrode layers 2204 may, for example, be formed by vapor deposition and/or some other suitable deposition process(es).

In some embodiments, the electrode dielectric layers 2202 are or comprise silicon oxide, a high k dielectric, some other suitable dielectric(s), or any combination of the foregoing. The high k dielectric may be or comprise, for example, hafnium oxide, zirconium oxide, aluminum oxide, tantalum oxide, titanium oxide, some other suitable high K dielectric(s), or any combination of the foregoing. In some embodiments, the electrode layers 2204 are or comprise titanium nitride, tantalum nitride, aluminum copper, some other suitable conductive material(s) and/or metal(s), or any combination of the foregoing.

The dielectric liner layer 112, the electrode dielectric layers 2202, and the electrode layers 2204 define a plurality of in-trench capacitor segments 106. The in-trench capacitor segments 106 are individual to and respectively in the trench segments 2004. Further, the in-trench capacitor segments 106 are arranged according to the trench pattern 2002 and, in some embodiments, have top layouts as in any of FIGS. 3 and 4A-4E. For example, the in-trench capacitor segments 106 may have a serpentine profile as in FIG. 4B.

The in-trench capacitor segments 106 may have greater coefficients of thermal expansion than the substrate segments 110, such that the in-trench capacitor segments 106 may expand by a greater amount than the substrate segments 110 during high temperature processes and/or high voltage processes. As a result, the in-trench capacitor segments 106 may apply stress on the substrate segments 110. The stress is neutral at a center of the trench pattern 2002 due to symmetry in the trench pattern 2002. However, the stress increases from the center of the trench pattern 2002 to edges of the trench pattern 2002 along the axis A.

As discussed with regard to FIG. 20, the substrate segments 110 at the edge of the trench pattern 2002 have greater widths than the substrate segments 110 at the interior of the trench pattern 2002. For example, compare the edge substrate segments 110e of FIG. 20 to the interior substrate segments 110i of FIG. 20. Because the substrate segments 110 at the edge of the trench pattern 2002 have greater widths than the substrate segments 110 at the interior of the trench pattern 2002, the substrate segments 110 at the edge of the trench pattern 2002 have greater rigidity than the substrate segments 110 at the interior of the trench pattern 2002. Because stress is greatest at the edge of the trench pattern 2002, the greater rigidity reduces the likelihood that the substrate segments 110 at the edge of the trench pattern 2002 will bend. This, in turn, reduces the likelihood of trench burnout and increases manufacturing yields.

Further, as discussed with regard to FIG. 20, the trench segments 2004 at the edge of the trench pattern 2002 have greater widths than the trench segments 2004 at the interior of the trench pattern 2002. For example, compare the edge trench segments 2004e of FIG. 20 to the interior trench segments 2004i of FIG. 20. Because the trench segments 2004 at the edge of the trench pattern 2002 have greater widths than the trench segments 2004 at the interior of the trench pattern 2002, the gaps 108 at the edge of the trench pattern 2002 are larger than the gaps 108 at the interior of the trench pattern 2002. The gaps 108 facilitate stress absorption, and the larger gaps at the edge of the trench pattern 2002 provide increased stress absorption at the edge of the trench pattern 2002 where stress is greatest. As a result, the substrate segments 110 at the edge of the trench pattern 2002 are less prone to bending and the likelihood of trench burnout at the edge of the trench pattern 2002 is reduced. This, in turn, increases manufacturing yields.

Figure 23:
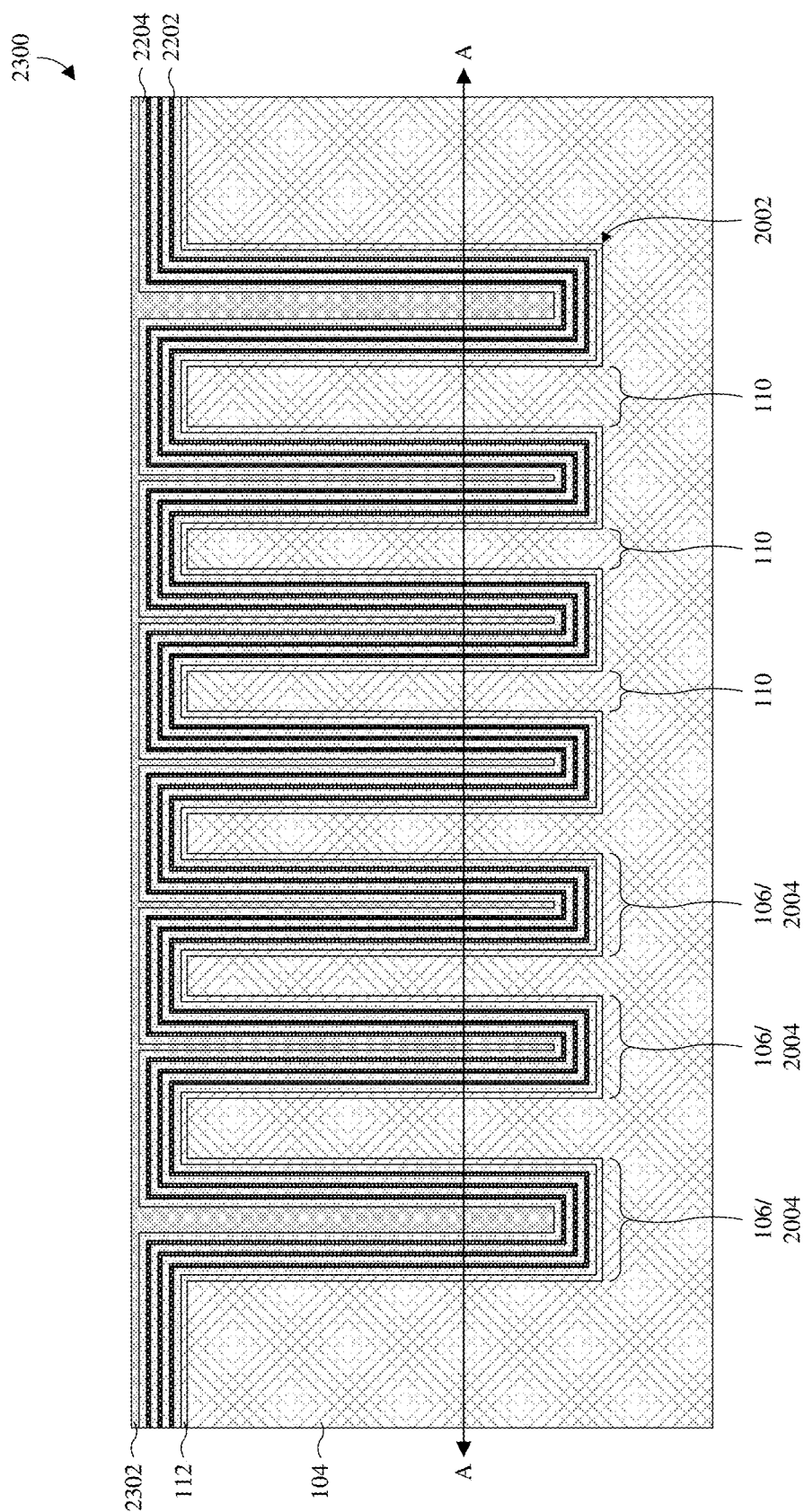

As illustrated by the cross-sectional view 2300 of FIG. 23, a cap layer 2302 is deposited. The cap layer 2302 is deposited covering the electrode dielectric layers 2202 and the electrode layers 2204. Further, the cap layer 2302 is deposited filling the gaps 108 (see, e.g., FIG. 22). In some embodiments, the cap layer 2302 fully fills the gaps 108. In other embodiments, the cap layer 2302 only partially fills the gaps 108.

In some embodiments, the cap layer 2302 is dielectric. For example, the cap layer 2302 may be silicon oxide and/or some other suitable dielectric(s). In some embodiments in which the cap layer 2302 is dielectric, the cap layer 2302 is deposited by atomic layer deposition (ALD) or some other suitable deposition process. In other embodiments, the cap layer 2302 is conductive. For example, the cap layer 2302 may be or comprise pure/elemental titanium, some other suitable metal(s), a metallic material, titanium nitride, tantalum nitride, some other suitable metal nitride(s), some other suitable conductive material(s), or any combination of the foregoing. In some embodiments in which the cap layer 2302 is conductive, the cap layer 2302 is deposited by metal-organic chemical vapor deposition (MOCVD) or some other suitable deposition process.

Figure 24:
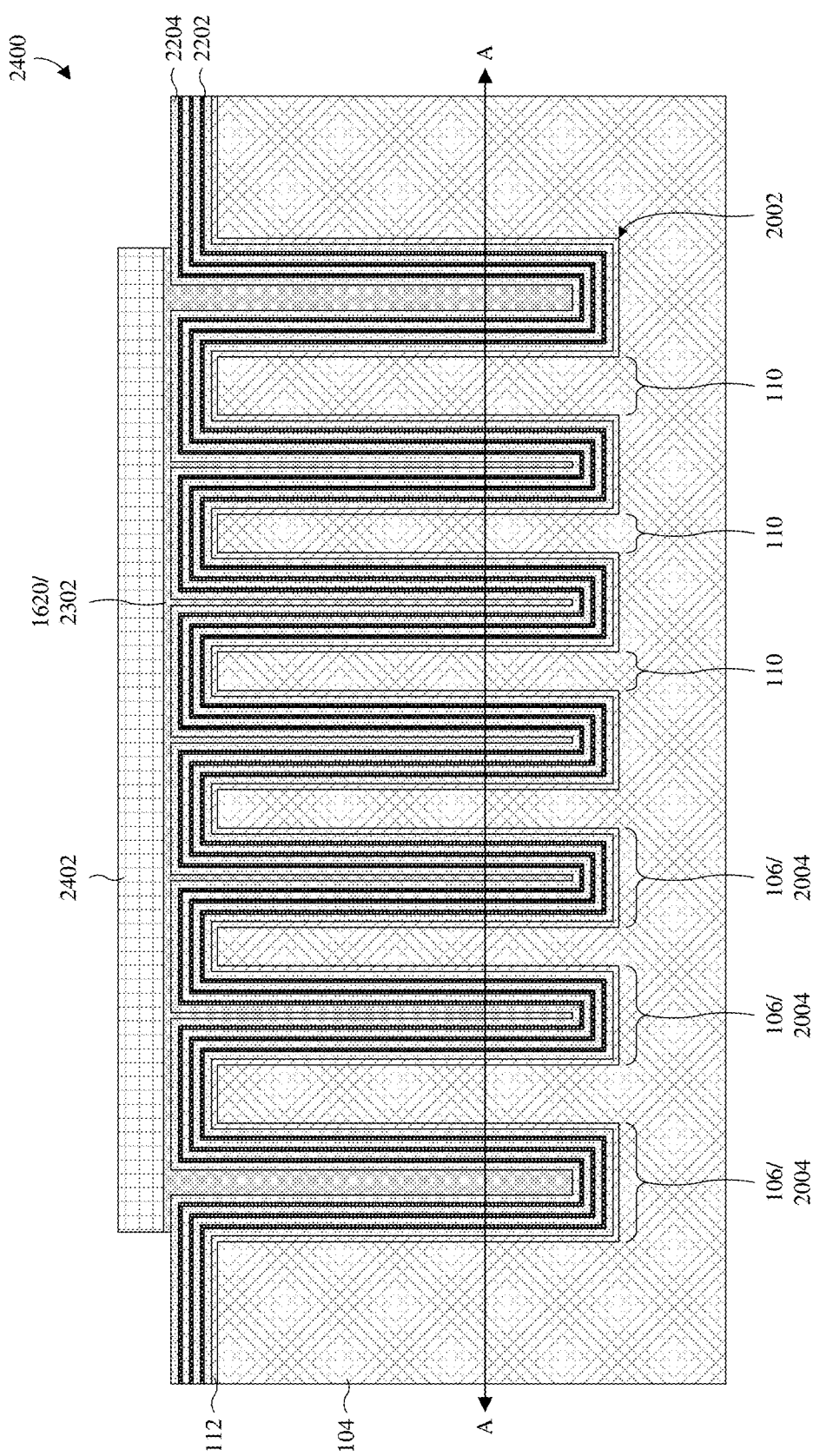

As illustrated by the cross-sectional view 2400 of FIG. 24, the cap layer 2302 is patterned to form a cap structure 1620 localized over the trench pattern 2002. In some embodiments, a process for patterning the cap layer 2302 comprises: 1) forming a photoresist mask 2402 over the cap layer 2302 by photolithography; 2) performing an etch into the cap layer 2302 with the photoresist mask 2402 in place; and 3) removing the photoresist mask 2402. Other processes are, however, amenable.

Figure 25:
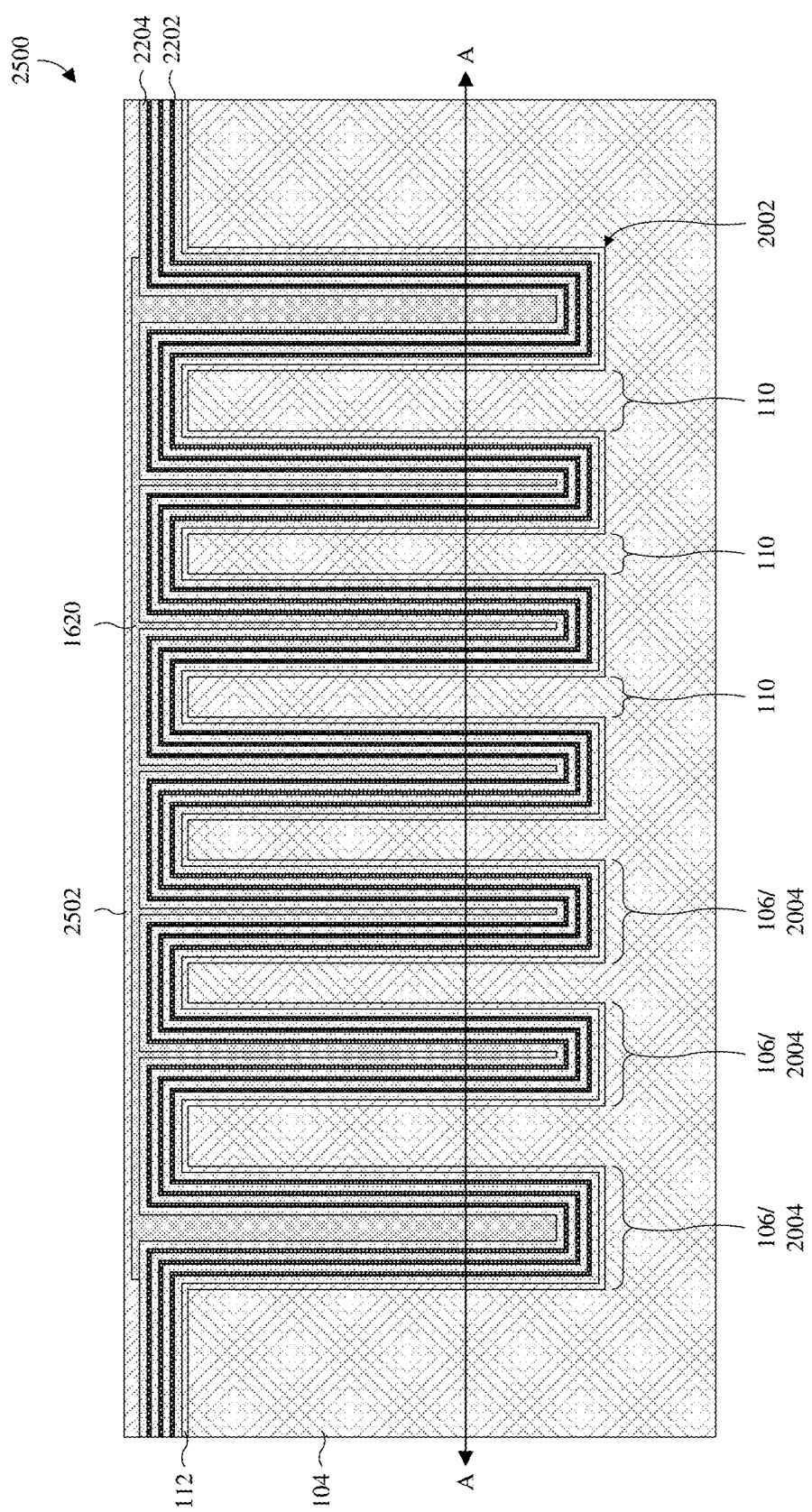

As illustrated by the cross-sectional view 2500 of FIG. 25, a hard mask layer 2502 is deposited over the cap structure 1620, the electrode dielectric layers 2202, and the electrode layers 2204. The hard mask layer 2502 may be or comprise, for example, silicon nitride, silicon oxide, silicon carbide, BARC, some other suitable hard mask material(s), or any combination of the foregoing. The hard mask layer 2502 may, for example, be formed by vapor deposition, spin on coating, or some other suitable deposition process. In some embodiments, the hard mask layer 2502 is or comprises BARC and is deposited by spin on coating, such that a top surface of the hard mask layer 2502 self-levels under the force of gravity.

Figure 26:
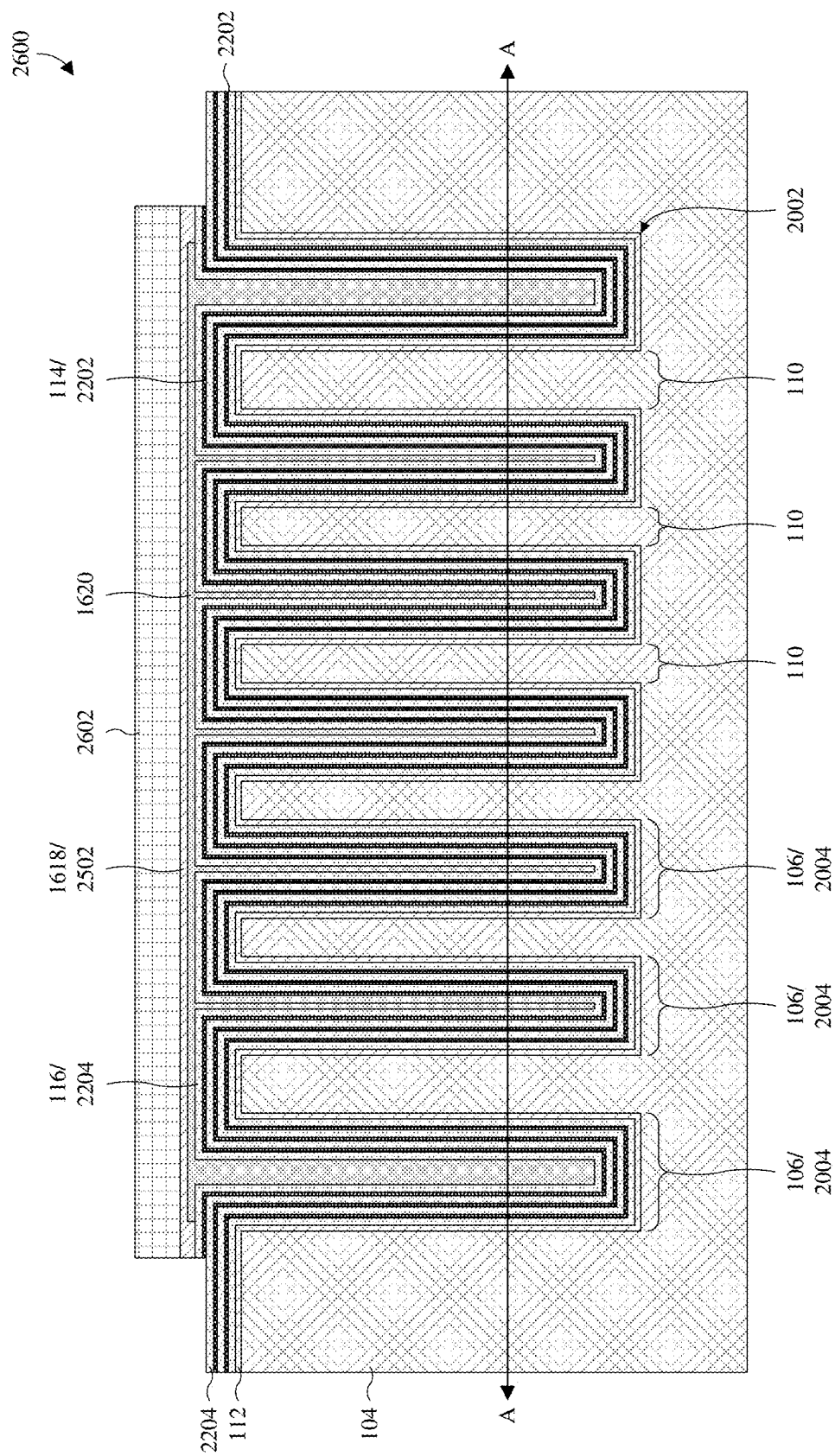

As illustrated by the cross-sectional view 2600 of FIG. 26, the hard mask layer 2502, a top one of the electrode layers 2204, and a top one of the electrode dielectric layers 2202 are patterned together. The patterning forms a hard mask 1618, a capacitor electrode 116, and a capacitor dielectric layer 114. The hard mask 1618 overlies the cap structure 1620. The capacitor electrode 116 underlies the hard mask 1618 and the cap structure 1620, and the capacitor dielectric layer 114 underlies the capacitor electrode 116. In some embodiments, a process for performing the patterning comprises: 1) forming a photoresist mask 2602 over the hard mask layer 2502 using photolithography; 2) performing an etch into the hard mask layer 2502, the top one of the electrode layers 2204, and the top one of the electrode dielectric layers 2202 with the photoresist mask 2602 in place; and 3) removing the photoresist mask 2602. Other processes are, however, amenable.

Figure 27:
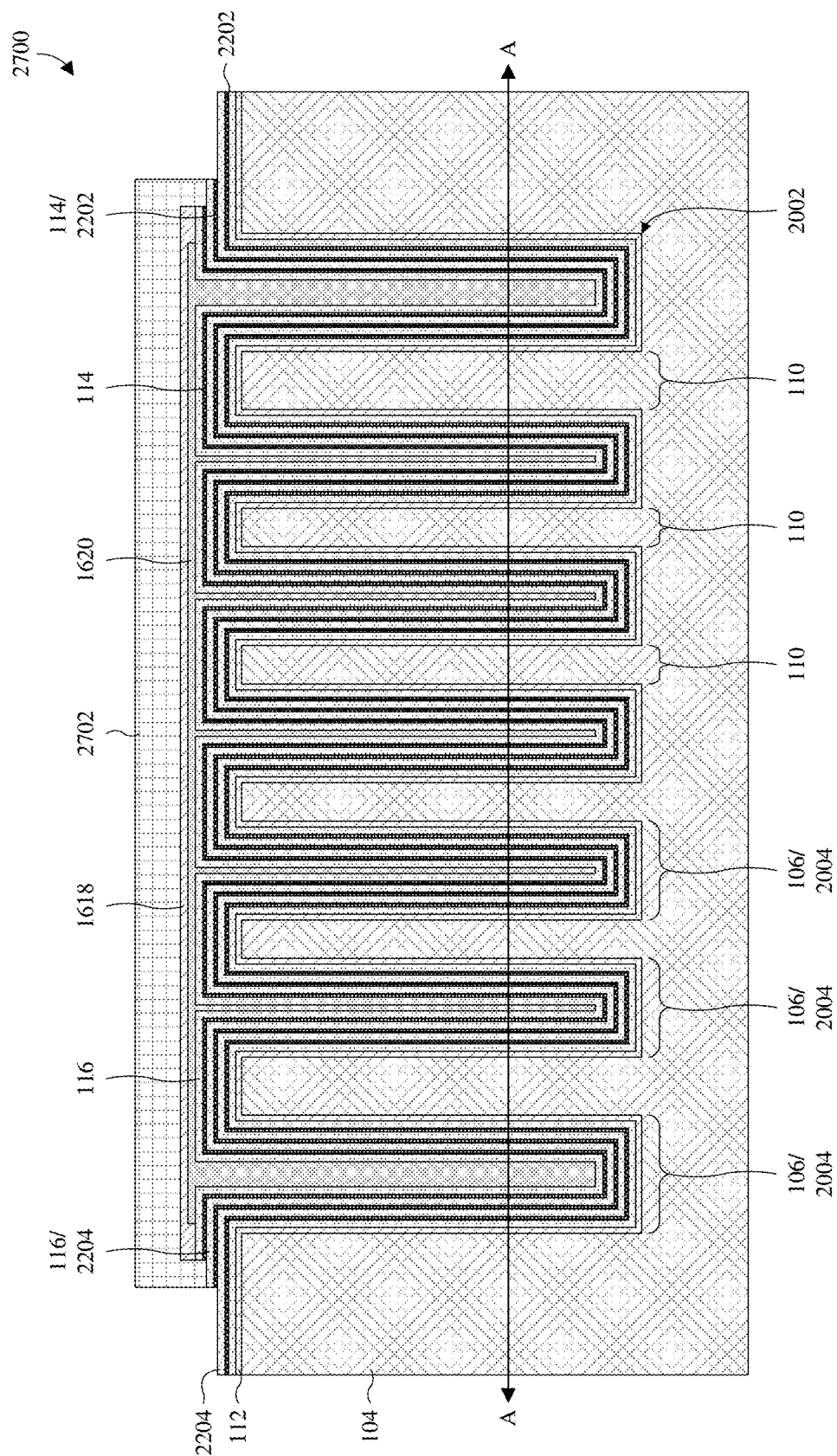
Figure 28:
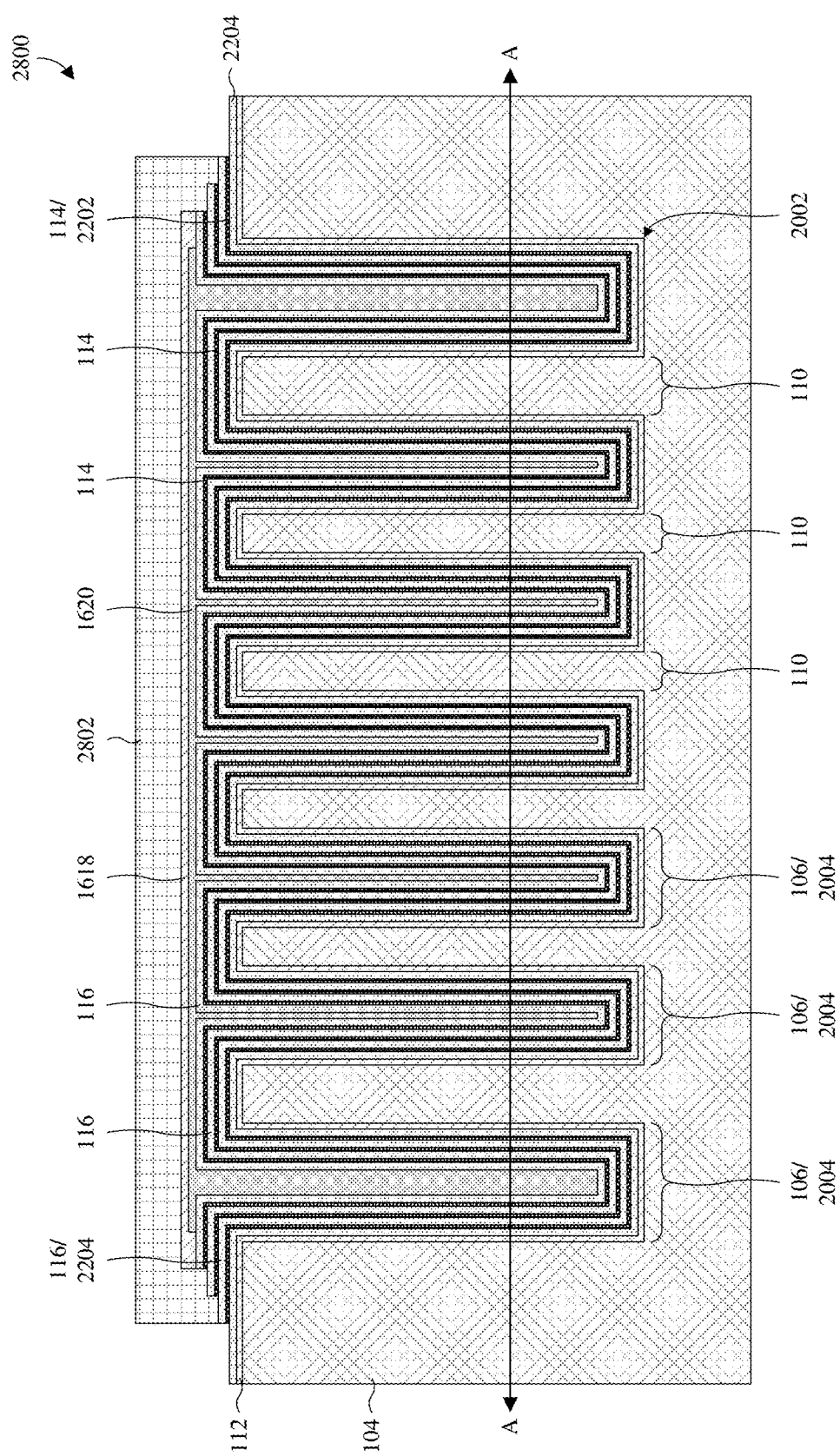
Figure 29:
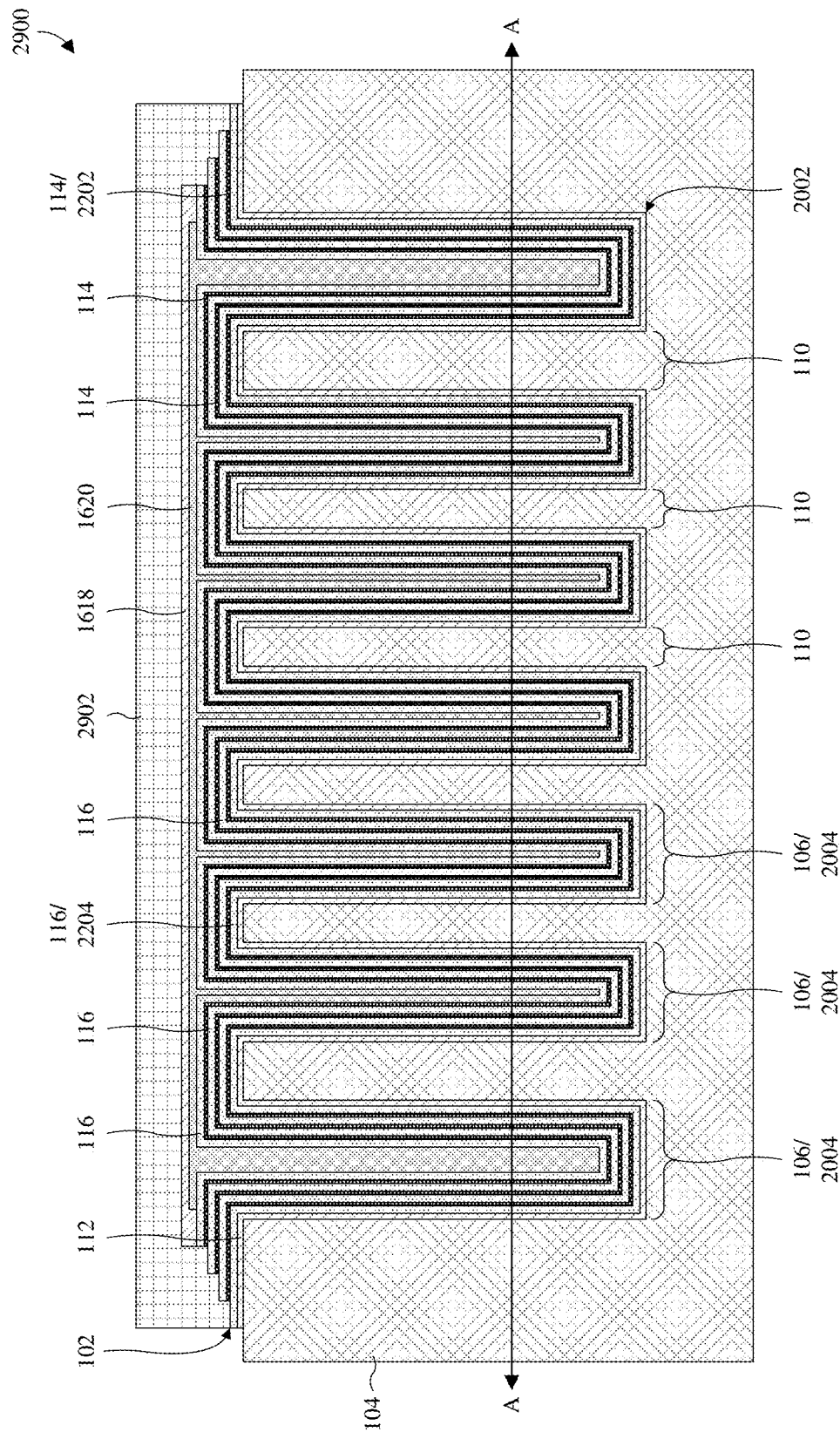

As illustrated by the cross-sectional views 2700-2900 of FIGS. 27-29, a remainder of the electrode dielectric layers 2202, a remainder of the electrode layers 2204, and the dielectric liner layer 112 are sequentially patterned from top to bottom. The remaining electrode layer and an immediately underlying electrode dielectric layer are patterned together. Further, the dielectric liner layer 112 and an immediately overlying electrode layer are patterned together. In alternative embodiments, the dielectric liner layer 112 is not patterned and is instead employed as an etch stop for the immediately overlying electrode layer. The patterning localizes the dielectric liner layer 112 to the trench pattern 2002 and forms additional capacitor electrodes 116 and additional capacitor dielectric layers 114 alternatingly stacked over the dielectric liner layer 112.

In some embodiments, the patterning of a remaining electrode layer and an immediately underlying dielectric layer comprises: 1) forming a photoresist mask over the electrode layer using photolithography; 2) performing an etch into the electrode layer and dielectric layer with the photoresist mask in place; and 3) removing the photoresist mask. Other processes are, however, amenable. Examples of the photoresist mask include a first photoresist mask 2702 at FIG. 27, a second photoresist mask 2802 at FIG. 28, and a third photoresist mask 2902 at FIG. 29.

After completing the patterning of FIGS. 26-29, a plurality of capacitor dielectric layers 114 and a plurality of capacitor electrodes 116 remain. The capacitor dielectric layers 114 and the capacitor electrodes 116 are alternatingly stacked and define a trench capacitor 102 comprising the in-trench capacitor segments 106. Further, while FIGS. 26-29 pattern each electrode layer and an immediately underlying electrode dielectric layer together, each electrode layer and an immediately overlying electrode dielectric layer may alternatively be patterned together.

Figure 30:
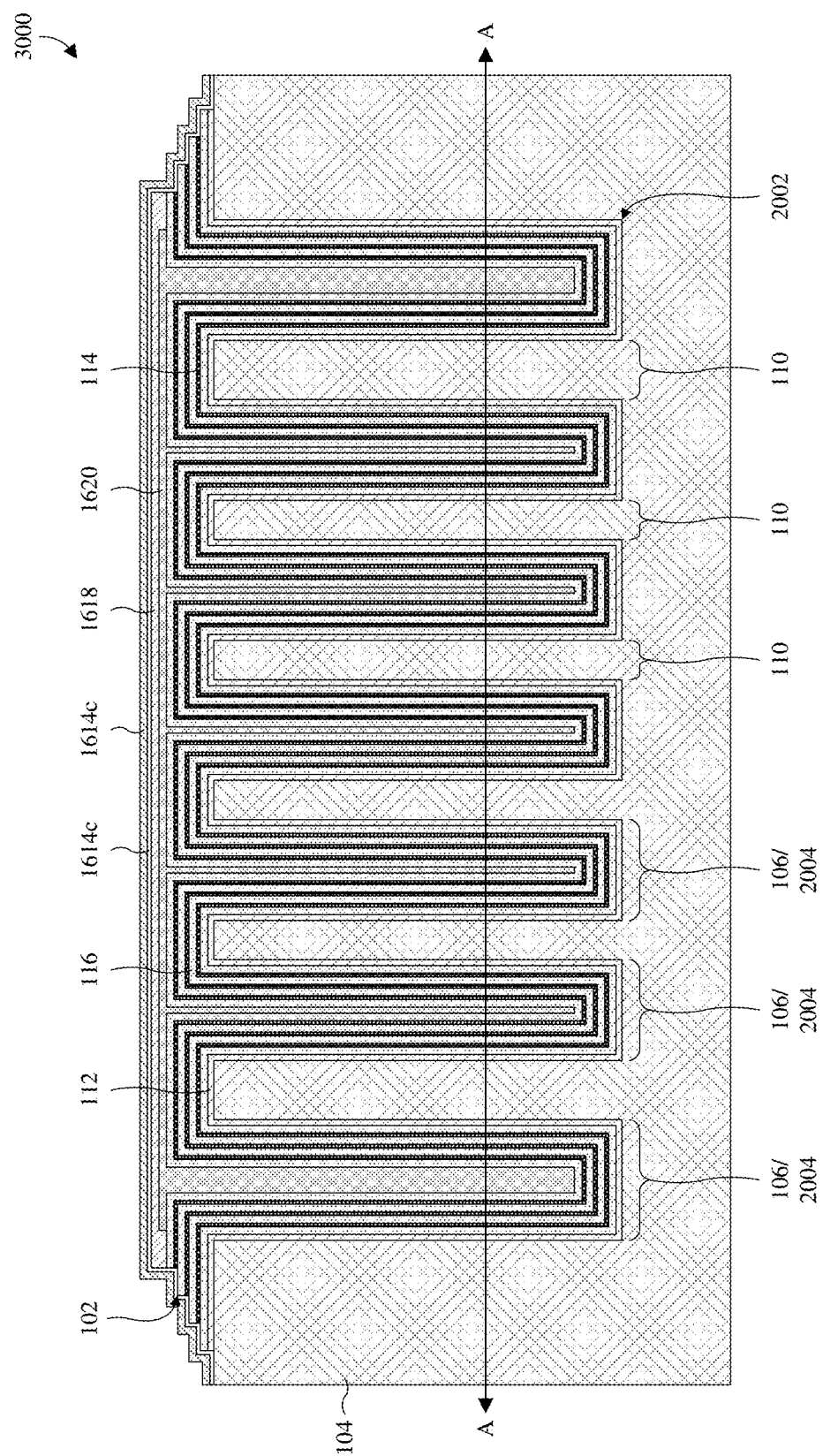

As illustrated by the cross-sectional view 3000 of FIG. 30, a pair of contact etch stop layers 1614c are deposited over the trench capacitor 102. In alternative embodiments, more contact etch stop layers are deposited. In alternative embodiments, only one contact etch stop layer is deposited. The contact etch stop layers 1614c are different dielectric materials and may be comprise, for example, oxide, silicon nitride, some other suitable dielectric(s), or any combination of the foregoing. In some embodiments, a bottom one of the contact etch stop layers 1614c is silicon oxide, whereas a top one of the contact etch stop layers 1614c is silicon nitride. Other suitable materials are, however, amenable. The contact etch stop layers 1614c may, for example, be formed by vapor deposition and/or some other suitable deposition process(es).

Figure 31:
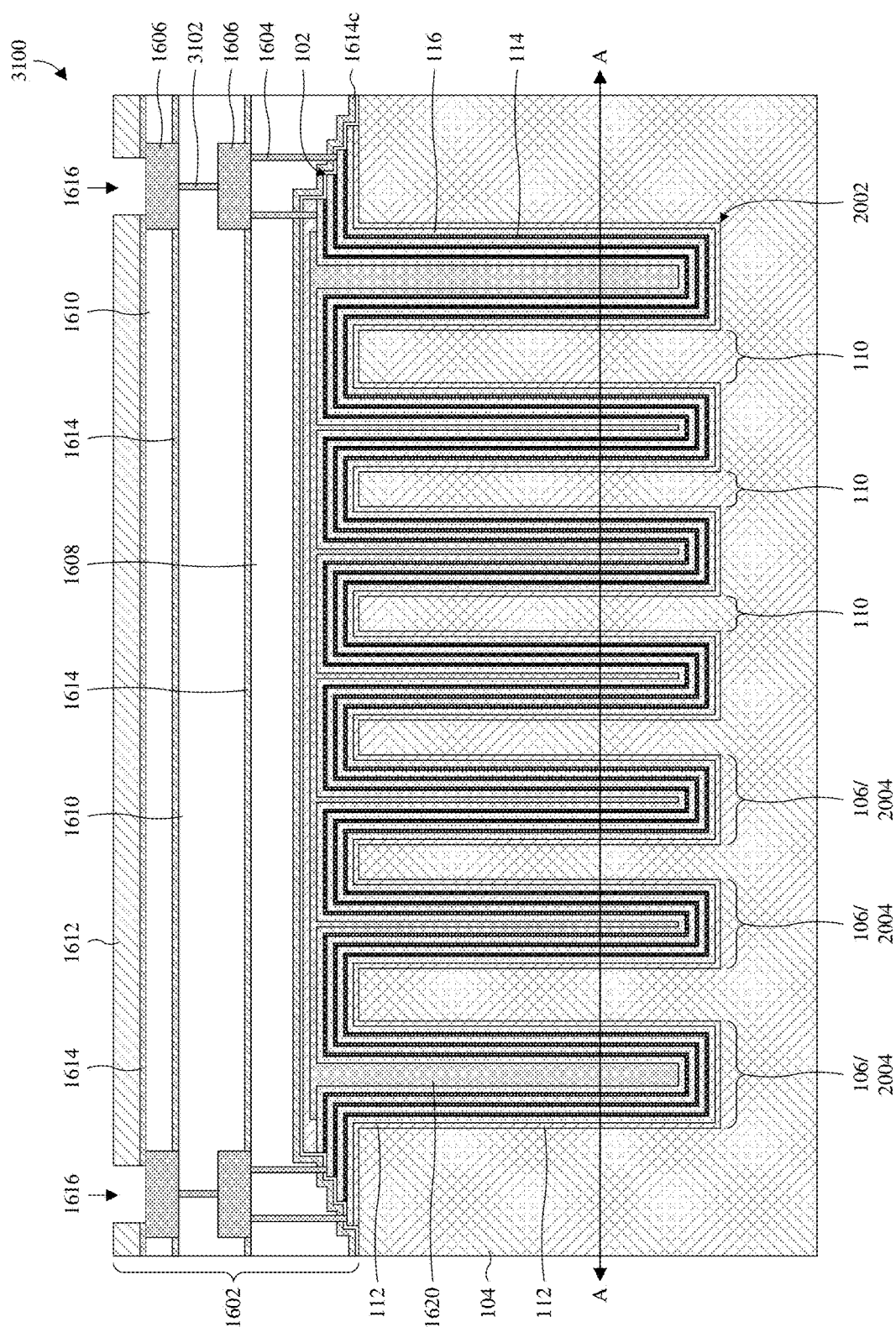

As illustrated by the cross-sectional view 3100 of FIG. 31, an interconnect structure 1602 is formed over the contact etch stop layers 1614c. The interconnect structure 1602 comprises a plurality of contacts 1604, a plurality of wires 1606, and a plurality of vias 3102. The contacts 1604 extend from the capacitor electrodes 116, and the wires 1606 and the vias 3102 are alternatingly stacked over and electrically coupled to the contacts 1604.

A dielectric structure surrounds the contacts 1604, the wires 1606, and the vias 3102. The dielectric structure comprises an ILD layer 1608, a plurality of IMD layers 1610, a passivation layer 1612, and a plurality of etch stop layers 1614. The passivation layer 1612 overlies the wires 1606 and defines openings 1616 exposing top wires. The IMD layers 1610 underlie the passivation layer 1612 and surround the wires 1606 and the vias 3102. The ILD layer 1608 underlies the IMD layers 1610 and surrounds the contacts 1604. The etch stop layers 1614 separate the ILD layer 1608, the IMD layers 1610, and the passivation layer 1612 from each other.

While FIGS. 20-31 are described with reference to a method, it will be appreciated that the structures shown in FIGS. 20-31 are not limited to the method but rather may stand alone separate of the method. Further, while FIGS. 20-31 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 32:
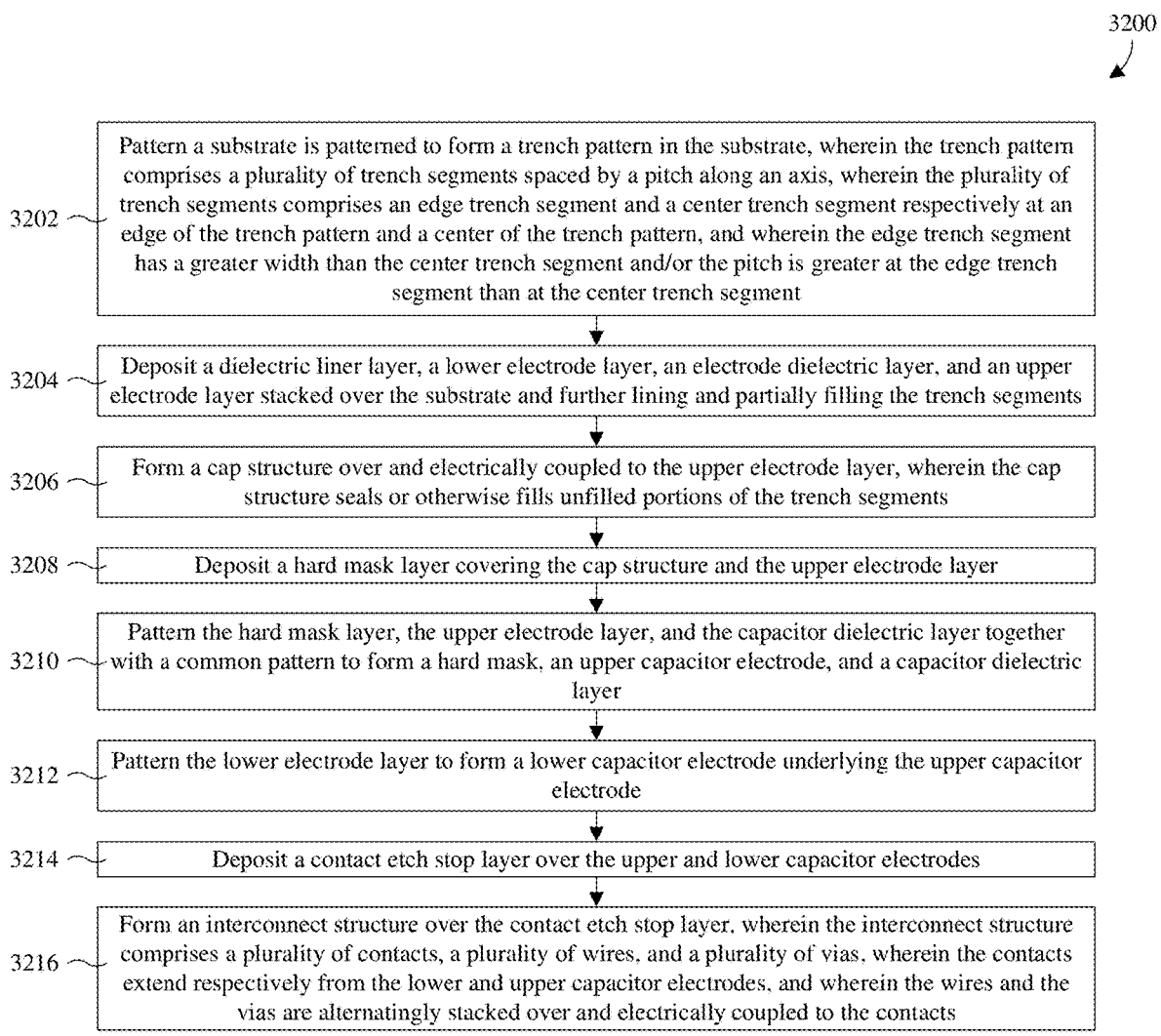
FIG. 32 illustrates a block diagram of some embodiments of the method of FIGS. 20-31.

With reference to FIG. 32, a block diagram 3200 of some embodiments of the method of FIGS. 20-31 is provided.

At 3202, a substrate is patterned to form a trench pattern in the substrate, wherein the trench pattern comprises a plurality of trench segments spaced by a pitch along an axis, wherein the plurality of trench segments comprises an edge trench segment and a center trench segment respectively at an edge of the trench pattern and a center of the trench pattern, and wherein the edge trench segment has a greater width than the center trench segment and/or the pitch is greater at the edge trench segment than at the center trench segment. See, for example, FIG. 20.

At 3204, a dielectric liner layer, a lower electrode layer, an electrode dielectric layer, and an upper electrode layer are deposited stacked over the substrate and further lining and partially filling the trench segments. See, for example, FIGS. 21 and 22.

At 3206, a cap structure is formed over and electrically coupled to the upper electrode layer, wherein the cap structure seals or otherwise fills unfilled portions of the trench segments. See, for example, FIGS. 23 and 24.

At 3208, a hard mask layer is deposited covering the cap structure and the upper electrode layer. See, for example, FIG. 25.

At 3210, the hard mask layer, the upper electrode layer, and the capacitor dielectric layer are patterned together with a common pattern to form a hard mask, an upper capacitor electrode, and a capacitor dielectric layer. See, for example, FIG. 26.

At 3212, the lower electrode layer is patterned to form a lower capacitor electrode underlying the upper capacitor electrode. See, for example, FIGS. 27-29. As described at 3210, the capacitor dielectric layer and the upper electrode layer are patterned together with a common pattern. In alternative embodiments, the capacitor dielectric layer and the lower electrode layer are patterned together with a common pattern.

At 3214, a contact etch stop layer is deposited over the upper and lower capacitor electrodes. See, for example, FIG. 30.

At 3216, an interconnect structure is formed over the contact etch stop layer, wherein the interconnect structure comprises a plurality of contacts, a plurality of wires, and a plurality of vias, wherein the contacts extend respectively from the lower and upper capacitor electrodes, and wherein the wires and the vias are alternatingly stacked over and electrically coupled to the contacts. See, for example, FIG. 31.

While the block diagram 3200 of FIG. 32 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an integrated chip including: a substrate; and a trench capacitor on the substrate and including a plurality of capacitor segments extending into the substrate; wherein the plurality of capacitor segments includes an edge capacitor segment at an edge of the trench capacitor and a center capacitor segment at a center of the trench capacitor, the capacitor segments are spaced with a pitch on an axis, and the edge capacitor segment has a greater width than the center capacitor segment and/or the pitch is greater at the edge capacitor segment than at the center capacitor segment. In some embodiments, the edge capacitor segment has a greater width than the center capacitor segment and the pitch is greater at the edge capacitor segment than at the center capacitor segment. In some embodiments, the edge capacitor segment has a greater width than the center capacitor segment, wherein the pitch is uniform from the edge capacitor segment to the center capacitor segment. In some embodiments, the edge capacitor segment has a same width as the center capacitor segment, wherein the pitch is greater at the edge capacitor segment than at the center capacitor segment. In some embodiments, the plurality of capacitor segments includes an intermediate capacitor segment between the edge and center capacitor segments, wherein the edge capacitor segment has a greater width than the intermediate capacitor segment, and wherein the intermediate capacitor segment has a greater width than the center capacitor segment. In some embodiments, the plurality of capacitor segments includes an intermediate capacitor segment between the edge and center capacitor segments, wherein the pitch is greater between the edge capacitor segment and the intermediate capacitor segment than between the intermediate capacitor segment and the center capacitor segment. In some embodiments, the capacitor segments have line-shaped top layouts.

In some embodiments, the present disclosure provides an integrated chip including: a substrate including a first substrate segment and a second substrate segment; and a trench capacitor on the substrate and including a center capacitor segment, an intermediate capacitor segment, and an edge capacitor segment; wherein the center, intermediate, and edge capacitor segments extend into the substrate, the center and edge capacitor segments are respectively at a center of the trench capacitor and an edge of the trench capacitor, the intermediate capacitor segment is between the center and edge capacitor segments, the first and second substrate segments separate the intermediate capacitor segment respectively from the center and edge capacitor segments, and the edge capacitor segment has a greater width than the center capacitor segment and/or the second substrate segment has a greater width than the first substrate segment. In some embodiments, the intermediate capacitor segment has a same width as the center capacitor segment, wherein the edge capacitor segment has a greater width than the center capacitor segment. In some embodiments, the intermediate capacitor segment has a greater width than the center capacitor segment, wherein the edge capacitor segment has a greater width than the intermediate capacitor segment. In some embodiments, the second substrate segment has a greater width than the first substrate segment. In some embodiments, the center, intermediate, and edge capacitor segments at least partially define a serpentine pattern in the substrate. In some embodiments, the center, intermediate, and edge capacitor segments partially define a grid pattern in the substrate. In some embodiments, the trench capacitor includes a plurality of capacitor electrodes and a plurality of capacitor dielectric layers, wherein the capacitor electrodes and the capacitor dielectric layers are depressed into the substrate at the center, intermediate, and edge capacitor segments, and wherein the capacitor electrodes and the capacitor dielectric layers wrap around tops of the first and second substrate segments.

In some embodiments, the present disclosure provides a method for forming a trench capacitor, the method including: patterning a substrate to form a trench pattern in the substrate, wherein the trench pattern includes a plurality of trench segments spaced by a pitch along an axis, wherein the plurality of trench segments includes an edge trench segment and a center trench segment respectively at an edge of the trench pattern and a center of the trench pattern, and wherein the edge trench segment has a greater width than the center trench segment and/or the pitch is greater at the edge trench segment than at the center trench segment; depositing a lower electrode layer, an electrode dielectric layer, and an upper electrode layer stacked over the substrate and lining the trench segments, wherein the dielectric electrode layer is between the lower and upper electrode layers; and patterning the lower and upper electrode layers and the dielectric electrode layer to respectively form a plurality of capacitor electrodes and a capacitor dielectric layer. In some embodiments, the edge and center trench segments have line-shaped top layouts that are elongated in parallel in a direction transverse to the axis. In some embodiments, the edge trench segment has a greater width than the center trench segment and the pitch is greater at the edge trench segment than at the center trench segment. In some embodiments, the plurality of trench segments includes an additional edge trench segment spaced from the center trench segment along the axis and on an opposite side of the center trench segment as the edge trench segment, wherein the edge trench segment and the additional edge trench segment have a same width. In some embodiments, the plurality of trench segments includes an intermediate trench segment between the edge and center trench segments on the axis, wherein the intermediate trench segment has a greater width than the center trench segment, and wherein the edge trench segment has a greater width than the intermediate trench segment. In some embodiments, the plurality of trench segments includes an intermediate trench segment between the edge and center trench segments on the axis, wherein the intermediate trench segment has a same width as the center trench segment, and wherein the edge trench segment has a greater width than the intermediate trench segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
    a substrate; and
    a trench capacitor on the substrate and comprising a plurality of capacitor segments extending into the substrate;
    wherein the plurality of capacitor segments comprises a first capacitor segment and a second capacitor segment,
    the plurality of capacitor segments are spaced from each other along an axis,
    the first capacitor segment has a width different than a width of the second capacitor segment,
    the first and second capacitor segments have individual top layouts with greatest dimensions extending transverse to the axis and the width of the first capacitor segment,
    the substrate has a first sidewall and a second sidewall respectively facing and bordering the first and second capacitor segments, and
    a height of the first sidewall is substantially the same as a height of the second sidewall.

2. The integrated chip according to claim 1, wherein a bottom surface of the first capacitor segment is level with a bottom surface of the second capacitor segment.

3. The integrated chip according to claim 1, wherein the plurality of capacitor segments comprises a third capacitor segment between the first capacitor segment and the second capacitor segment, and wherein the third capacitor segment has a width greater than the width of the first capacitor segment and less than the width of the second capacitor segment.

4. The integrated chip according to claim 1, wherein the plurality of capacitor segments are spaced along the axis with a uniform pitch.

5. The integrated chip according to claim 1, wherein the plurality of capacitor segments are spaced along the axis with a pitch discretely increasing from a center of the trench capacitor to an edge of the trench capacitor.

6. The integrated chip according to claim 1, wherein the trench capacitor has a symmetrical cross-sectional profile.

7. The integrated chip according to claim 1, wherein the first capacitor segment is at a center of the trench capacitor and has a smallest width amongst the plurality of capacitor segments, and wherein the trench capacitor has only one capacitor segment having the smallest width.

8. An integrated chip, comprising:
a substrate; and
a trench capacitor on the substrate and comprising a plurality of capacitor segments, which extend into the substrate and are spaced along an axis;
wherein the plurality of capacitor segments comprises a first pair of neighboring capacitor segments and a second pair of neighboring capacitor segments,
the plurality of capacitor segments have individual heights that are substantially the same,
the plurality of capacitor segments have individual top layouts with greatest dimensions extending transverse to the axis,
the first pair of neighboring capacitor segments are separated from each other by a first separation along the axis, and
the second pair of neighboring capacitor segments are separated from each other by a second separation more than the first separation along the axis.

9. The integrated chip according to claim 8, wherein the first pair of neighboring capacitor segments are closer to a center of the trench capacitor than the second pair of neighboring capacitor segments.

10. The integrated chip according to claim 8, wherein the first pair of neighboring capacitor segments comprise a capacitor segment, and wherein the second pair of neighboring capacitor segments further comprise the capacitor segment.

11. The integrated chip according to claim 8, wherein the first pair of neighboring capacitor segments comprise a first capacitor segment and a second capacitor segment, wherein the second pair of neighboring capacitor segments comprise a third capacitor segment and a fourth capacitor segment, and wherein the first, second, third, and fourth capacitor segments are different from each other.

12. The integrated chip according to claim 8, wherein the first pair of neighboring capacitor segments comprise a first capacitor segment and a second capacitor segment, and wherein the first and second capacitor segments have individual widths that extend parallel with the axis and that are the same.

13. The integrated chip according to claim 12, wherein the second pair of neighboring capacitor segments comprise a third capacitor segment and a fourth capacitor segment, and wherein the third and fourth capacitor segments have individual widths that extend parallel with the axis and that are different.

14. The integrated chip according to claim 12, wherein the second pair of neighboring capacitor segments comprise a third capacitor segment and a fourth capacitor segment, and wherein the third and fourth capacitor segments have individual widths that extend parallel with the axis and that are the same.

15. An integrated chip, comprising:
a substrate; and
a trench capacitor on the substrate and comprising a plurality of capacitor segments, which extend into the substrate, are spaced from each other along an axis, and each have a sidewall facing a common direction along the axis;
wherein the plurality of capacitor segments comprises an edge capacitor segment at an edge of the trench capacitor, a first neighboring capacitor segment neighboring the edge capacitor segment, a center capacitor segment at a center of the trench capacitor, and a second neighboring capacitor segment neighboring the center capacitor segment,
the sidewall of the edge capacitor segment and the sidewall of the first neighboring capacitor segment have a first separation along the axis,
the sidewall of the center capacitor segment and the sidewall of the second neighboring capacitor segment have a second separation different than the first separation along the axis,
the edge and center capacitor segments have substantially the same heights, and
the edge and center capacitor segments have individual top layouts with greatest dimensions extending transverse to the axis.

16. The integrated chip according to claim 15, wherein the second separation is less than the first separation.

17. The integrated chip according to claim 15, wherein the edge capacitor segment and the first neighboring capacitor segment are separated from each other along the axis by a third separation, wherein the center capacitor segment and the second neighboring capacitor segment are separated from each other along the axis by a fourth separation, and wherein the third separation is greater than the fourth separation.

18. The integrated chip according to claim 15, wherein the edge capacitor segment has a width greater than a width of the center capacitor segment, and wherein the width of the edge capacitor segment and the width of the center capacitor segment extend parallel with the axis.

19. The integrated chip according to claim 15, wherein the edge capacitor segment has a width greater than a width of the first neighboring capacitor segment, and wherein the width of the edge capacitor segment and the width of the first neighboring capacitor segment extend parallel with the axis.

20. The integrated chip according to claim 15, wherein the center capacitor segment has a width less than a width of the second neighboring capacitor segment, and wherein the width of the center capacitor segment and the width of the second neighboring capacitor segment extend parallel with the axis.

\* \* \* \* \*